United States Patent
Itoo

(10) Patent No.: US 10,732,473 B2
(45) Date of Patent: Aug. 4, 2020

(54) DISPLAY DEVICE

(71) Applicant: Sharp Kabushiki Kaisha, Sakai, Osaka (JP)

(72) Inventor: Tsuyoshi Itoo, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/266,289

(22) Filed: Feb. 4, 2019

(65) Prior Publication Data

US 2019/0243197 A1    Aug. 8, 2019

(30) Foreign Application Priority Data

Feb. 5, 2018   (JP) .................................. 2018-018270

(51) Int. Cl.
| | |
|---|---|
| *G02F 1/1362* | (2006.01) |
| *G02F 1/1339* | (2006.01) |
| *H01L 27/12* | (2006.01) |

(52) U.S. Cl.
CPC .... *G02F 1/136286* (2013.01); *G02F 1/13394* (2013.01); *G02F 1/136209* (2013.01); *H01L 27/124* (2013.01); *G02F 2001/136222* (2013.01)

(58) Field of Classification Search
CPC .......... G02F 1/13394; G02F 1/136209; G02F 1/136286
See application file for complete search history.

(56) References Cited

U.S. PATENT DOCUMENTS

| | | | |
|---|---|---|---|
| 2015/0162357 A1 | 6/2015 | Miyanaga et al. | |
| 2015/0340510 A1 | 11/2015 | Miyanaga et al. | |
| 2016/0238903 A1* | 8/2016 | Morimoto | ........... G02F 1/13394 |
| 2017/0077312 A1 | 3/2017 | Miyanaga et al. | |
| 2017/0192281 A1* | 7/2017 | Kwon | ................. G02F 1/13394 |
| 2018/0069130 A1 | 3/2018 | Miyanaga et al. | |

FOREIGN PATENT DOCUMENTS

JP    2015-111190 A    6/2015

* cited by examiner

*Primary Examiner* — Michael H Caley
*Assistant Examiner* — Mariam Qureshi
(74) *Attorney, Agent, or Firm* — Keating & Bennett, LLP

(57) ABSTRACT

A display device includes a pair of substrates, lines, a spacer, and an annular line part. The substrates are disposed so as to be opposed to each other with an interval therebetween. The lines are installed on the array substrate between the paired substrates. The spacer is formed on the CF substrate so as to be interposed between the paired substrates. The annular line part is composed of one portion of the lines and has an annular shape so as to form a concave part for receiving the spacer on the center side are provided.

9 Claims, 23 Drawing Sheets

DISPLAY DEVICE

CROSS REFERENCE TO RELATED APPLICATION

This application claims priority from Japanese Patent Application No. 2018-018270 filed on Feb. 5, 2018. The entire contents of the priority application are incorporated herein by reference.

TECHNICAL FIELD

The present invention relates to a display device.

BACKGROUND

A display device described in Japanese Unexamined Patent Application Publication No. 2015-111190 is provided with: an island-shaped first light shielding layer, a second light shielding layer that is isolated from the first light shielding layer and has a shape different from that of the first shielding layer, a first semiconductor layer that intersects with the first light shielding layer, a second semiconductor layer that intersects with the second light shielding layer, a gate line that extends in a first direction and is opposed to the first light shielding layer to intersect with the first semiconductor layer, and is also opposed to the second light shielding layer to intersect with the second semiconductor layer, a first source line that extends in a second direction and is opposed to the first light shielding layer, a second source line that extends in the second direction and is opposed to the second light shielding layer, a switching element electrically connected to the gate line and the first source line, and a pixel electrode that is electrically connected to the switching element and opposed to the first light shielding layer and the second light shielding layer, and in this structure, an area where the first light shielding layer and the pixel electrode are made face to face with each other is equal to an area where the second light shielding layer and the pixel electrode are made face to face with each other.

In the display device described in the above-mentioned Patent Literature 1, a pillar-shaped spacer for use in maintaining a cell gap between a pair of substrates is disposed in an area overlapped with a light shielding layer. Therefore, the pillar-shaped spacer is disposed at a position that overlaps with an intersecting portion between the gate line and the source line. The intersecting portion between the gate line and the source line is slightly raised in comparison with the peripheral portion. For this reason, for example, when a positional deviation occurs at the time of sticking a pair of substrates together, the pillar-shaped spacer fails to be made in contact with the intersecting portion between the gate line and the source line, falling in the peripheral portion, with the result that the cell gap cannot be properly maintained. In addition to this, when an external force is exerted in a state where, for example, the pillar shaped spacer is made in contact with the intersecting portion between the gate line and the source line, the pillar-shaped spacer undesirably slides at the above-mentioned intersecting portion, with the result that it sometimes falls in the peripheral portion. In response to the sliding of the pillar-shaped spacer, the surface state of an alignment film disposed at the intersecting portion might deteriorate, with the result that an alignment failure of liquid crystal occurs to subsequently cause a luminescent point defect. In particular, in the case when miniaturization and high precision of the display device are intended, since both of the pillar-shaped spacer and the intersecting portion tend to become smaller, the situation in which the pillar-shaped spacer falls in the periphery of the intersecting portion tends to more easily occur.

SUMMARY

The technology described herein was made in view of the above circumstances. An object is to suppress the positional deviation of the spacer. Another object is to ensure high resistance to externally applied force, to ensure high recovery properties for the paired substrates deformed by external force and high display quality.

The display device according to the technology described herein is provided with a pair of substrates disposed so as to be opposed to each other with an interval therebetween, lines installed on one of the above-mentioned paired substrates, a spacer installed on the other substrate so as to be interposed between the paired substrates and an annular line part that is composed of one portion of the line, and has an annular shape with a concave portion to receive the spacer formed on the center side.

With this structure, since the spacer formed on the other substrate is interposed between the paired substrates, the interval between the paired substrates is maintained. One portion of the line formed on the one of the substrates is formed into the annular line part having an annular shape with a concave portion to receive the spacer formed on the center side; therefore, even when a positional deviation occurs between the paired substrates or when an external force is exerted thereon, since the spacer is received by the concave portion formed on the center side of the annular line part, the spacer is prevented from being positionally deviated from the outside of the concave portion. Thus, the interval between the paired substrates can be more positively maintained by the spacer so that high display quality can be desirably maintained.

According to the technology described herein, it becomes possible to suppress the positional deviation of a spacer. Furthermore, according to the technology described herein, high resistance to an applied external force, high recovery properties of the paired substrates deformed by the external force, and high display quality are ensured.

DETAILED DESCRIPTION

First Embodiment

A first embodiment will be described with reference to FIGS. 1 to 8. In the present embodiment, a liquid crystal display device 10 is exemplified. Additionally, on one portion of each drawing, X-axis, Y-axis and Z-axis are indicated, and illustrations are given so that the respective axis directions correspond to directions shown in each drawing. Moreover, with respect to the vertical directions, based upon FIG. 3 and FIGS. 5 to 8, the upper side of each of these drawings is defined as the surface side, and the lower side thereof is defined as the back surface side.

Figure 1:
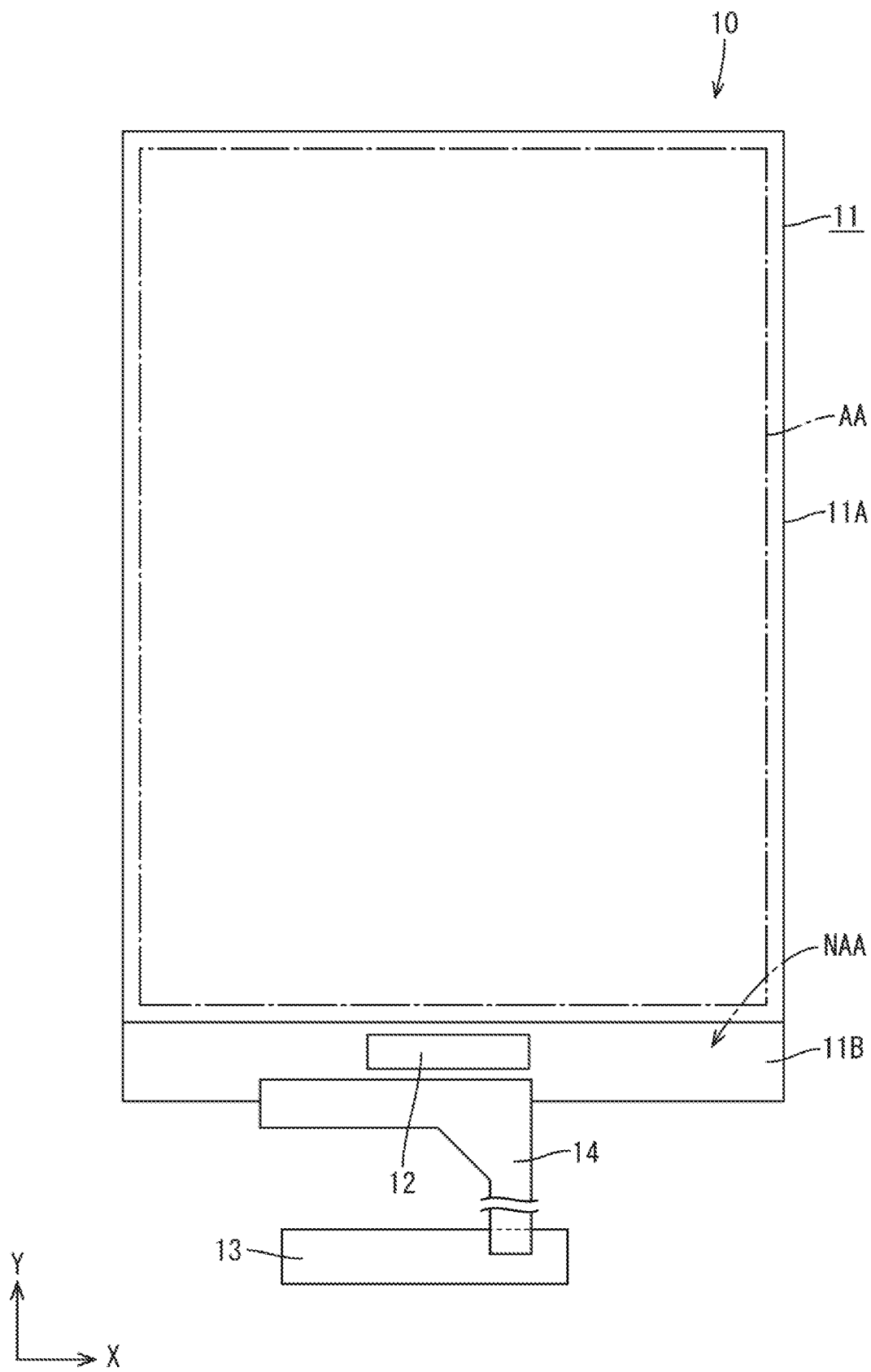
FIG. 1 is a schematic plan view showing a connection configuration among a liquid crystal panel, a flexible substrate and a control circuit board that constitute a liquid crystal display device in accordance to a first embodiment.

As shown in FIG. 1, the liquid crystal display device 10 is provided with a liquid crystal panel 11 capable of displaying images, and a back light device (not shown) that is disposed on the back side of the liquid crystal panel 11 and serves as an external light source for emitting light for use in displaying the liquid crystal panel 11. On the liquid crystal panel 11, a driver 12 for carrying out display driving and a flexible substrate (external connection part) 14 are assembled, with an ACF (Anisotropic Conductive Film) interposed therebetween. To the flexible substrate 14, a control circuit board (external signal supply source) 13 for externally supplying various input signals to the driver 12 is connected.

As shown in FIG. 1, the liquid crystal panel 11 has a rectangular shape (square shape) as a whole. Of the plate surface (display surface) of the liquid crystal panel 11, the center side is set to a display area (active area) AA capable of displaying images and the peripheral side is set to a non-display area (non-active area) NAA having a frame shape (picture frame like shape) in a plan view. Additionally, in FIG. 1, a one-dot chain line shows an outside shape of the display area AA, and an area outside of the one-dot chain line forms the non-display area NAA. The liquid crystal panel 11 has at least a pair of substrates 11A and 11B made of glass, and of these, the surface side (front face side) forms a CF substrate (opposed substrate) 11A and the rear surface side (back surface side) forms an array substrate (thin film transistor substrate, active matrix substrate, TFT substrate) 11B. Additionally, onto outer surface sides of the two substrates 11A and 11B, polarizing plates, not shown respectively, are affixed.

Figure 2:
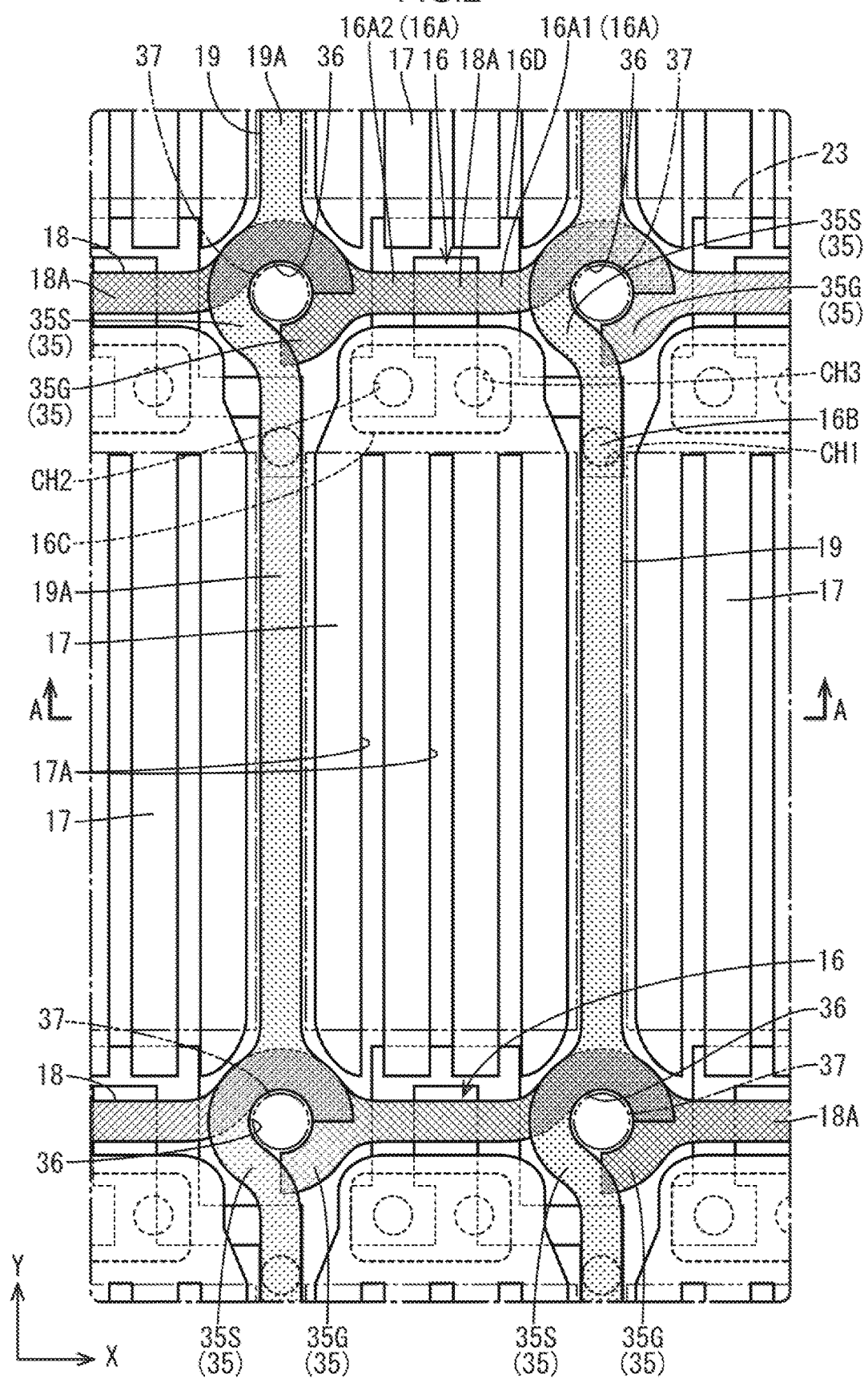
FIG. 2 is a plan view that schematically shows a line configuration in a display area of the liquid crystal panel.

As shown in FIG. 2, on the inner surface side of the display area AA of the array substrate 11B, TFT's (thin film transistors) 16 serving as switching elements and pixel electrodes 17 are installed in parallel with one another in a matrix pattern with a large number of pieces (matrix shape). Around the TFT 16 and the pixel electrode 17, a gate line (first line, scanning line) 18 and a source line (second line, signal line, data line) 19, each forming a lattice pattern, are disposed in a manner so as to surround these. The gate line 18 is disposed relatively on the lower layer side and extends substantially linearly along the X-axis direction, while the source line 19 is disposed relatively on the upper layer side and extends substantially linearly along the Y-axis direction. Additionally, in FIG. 2, the gate line 18 and the source line 19 are illustrated as mutually different shaded states. The TFT 16 is provided with a gate electrode 16A to be connected to the gate line 18, a source electrode 16B to be connected to the source line 19, a drain electrode 16C to be connected to the pixel electrode 17 and a channel part 16D to be connected to the source electrode 16B and the drain electrode 16C. Moreover, the TFT 16 is driven based upon a scanning signal supplied to the gate line 18. Then, an electric potential relating to an image signal supplied to the source line 19 is further supplied to the drain electrode 16C through the channel part 16D so that the pixel electrode 17 is charged to the electric potential relating to the image signal. Additionally, with respect to a detailed configuration of the TFT 16, explanation will be given later.

As shown in FIG. 2, the pixel electrode 17 is disposed on an area having an approximately longitudinally long rectangular shape surrounded by the gate lines 18 and the source lines 19 forming pairs respectively. On the pixel electrode 17, a plurality of slits (three in FIG. 2) 17A, which extend along the long side of itself, are formed so as to be opened. On the lower layer side from the pixel electrode 17 of the array substrate 11B, a common electrode 20 having an approximately solid state is formed so as to overlap the pixel electrode 17. When a potential difference is generated between the pixel electrode 17 and the common electrode 20 overlapped thereon, it is supposed that a lateral electric field is generated between the end part of the slit 17A in the pixel electrode 17 and the common electrode 20.

Figure 3:
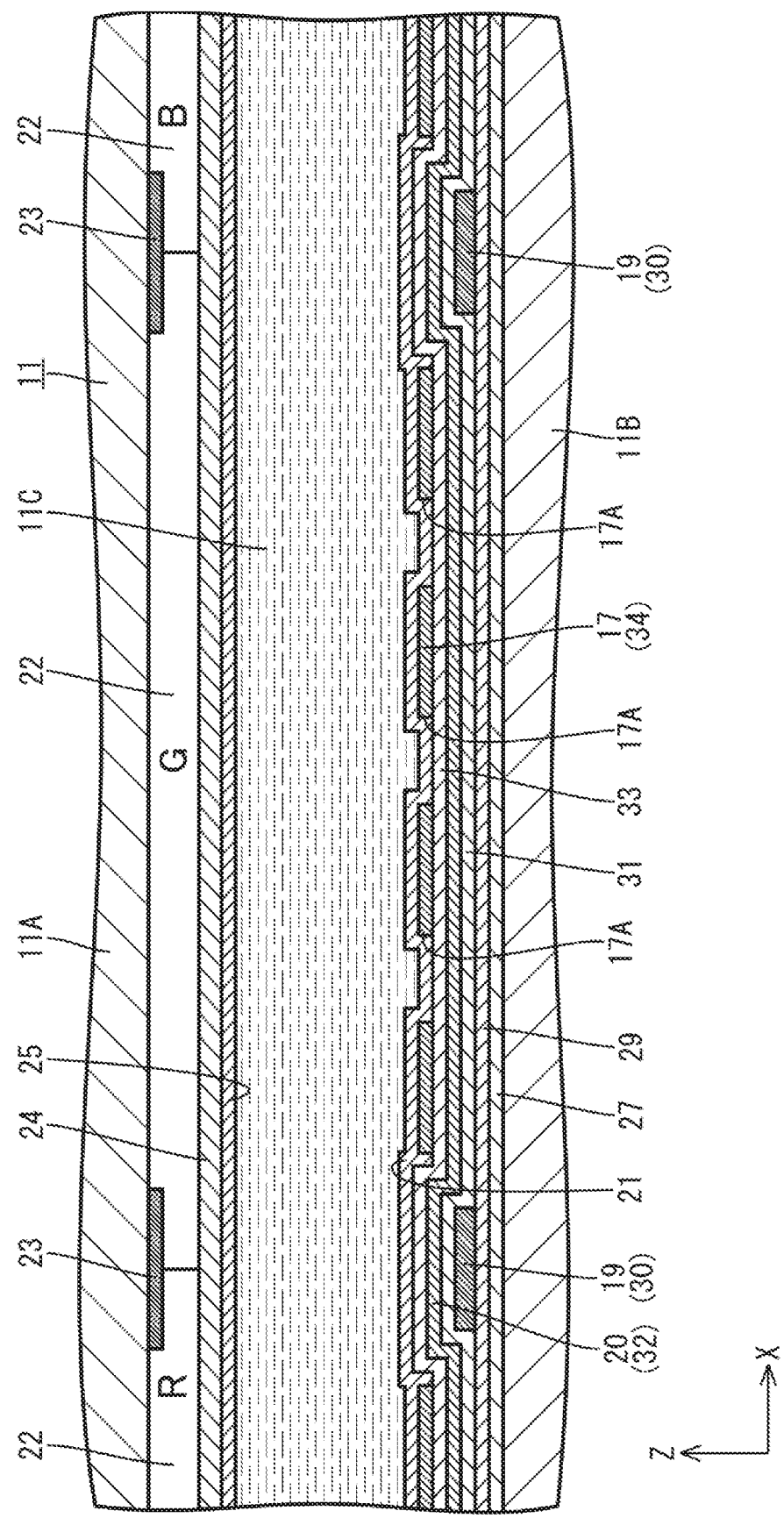
FIG. 3 is a cross-sectional view taken along line A-A of FIG. 2 in the liquid crystal panel.

As shown in FIG. 3, the liquid crystal panel 11 is designed so that the liquid crystal layer (medium) 11C is sandwiched between the paired substrates 11A and 11B. Additionally, FIG. 3 is a cross-sectional view obtained by cutting the pixel part in the vicinity of the center portion in the liquid crystal panel 11. In the liquid crystal layer 11C, horizontally aligning liquid crystal molecules (medium) are included. That is, the liquid crystal panel 11 of the present embodiment has a so-called IPS (In-Plane Switching) mode. Therefore, by controlling the lateral electric field generated between the end part of the slit 17A in the pixel electrode 17 and the common electrode 20 based upon an electric potential applied to the pixel electrode 17, the alignment state of the liquid crystal molecules contained in the liquid crystal layer 11C can be controlled. Thus, the transmission light amount of the pixel electrode 17 (pixel part) can be individually controlled. Moreover, the innermost plane in the array substrate 11B is provided with an array side alignment film 21 composed of an alignment material such as polyimide or the like formed thereon. The surface of the array side alignment film 21 is subjected to a rubbing treatment or a light alignment treatment.

As shown in FIG. 3, on the inner surface side in the display area AA of the CF substrate 11A, at least a color filter 22 and a light shielding part 23 are formed. The color filter 22 is provided so as to exert three colors of blue (B), green (G) and red (R). The color filter 22 is designed such that a large number of materials having mutually different colors are repeatedly aligned along the gate line 18 (X-axis direction) and these are allowed to extend along the source line 19 (Y-axis direction); thus, these are arranged in a stripe shape as a whole. These color filters 22 are disposed so as to overlap with the respective pixel electrodes 17 on the array substrate 11B side, when seen in the plan view. In this liquid crystal panel 11, the blue, green and red color filters 22 aligned in the X-axis direction and three pixel electrodes 17 respectively opposed to the color filters 22 constitute pixel parts of three colors respectively. Moreover, display pixels capable of displaying colors of predetermined gradations are constituted by the pixel parts having the three colors of blue, green and red adjacent to one another that are aligned along the X-axis direction. Furthermore, on the inner surface side (upper layer side) of the color filter 22, an overcoat film (flattening film) 24 is stacked and formed, and on the further inner surface side thereof, a CF side alignment film 25 is stacked and formed. In the same manner as in the array side alignment film 21, the CF side alignment film 25 is made of an alignment material such as polyimide or the like, and the surface thereof is subjected to a rubbing treatment or a light alignment treatment.

Figure 4:
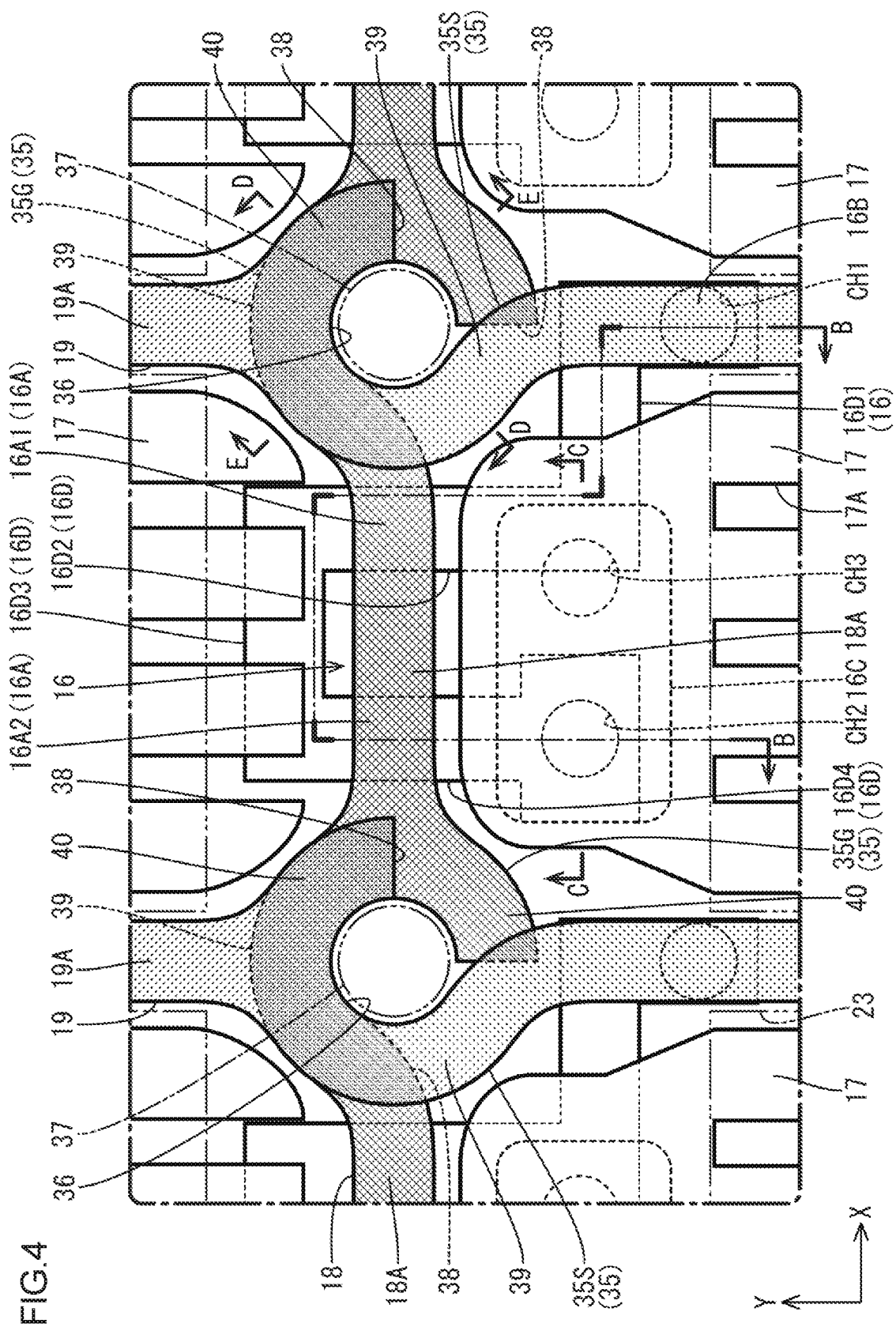
FIG. 4 is a plan view that shows the vicinity of a TFT in an enlarged manner in the display area of the liquid crystal panel.

As shown in FIG. 4, the light shielding part 23 is formed so as to partition between the respective adjacent color filters 22 in the X-axis direction as well as in the Y-axis direction, has a lattice pattern that is in parallel with the gate line 18 and the source line 19 respectively. FIG. 4 is a plan view showing the vicinity of the TFT 16 in an enlarged manner. Additionally, in FIG. 2 and FIG. 4, the light shielding part 23 is illustrated by two-dots chain line. The light shielding part 23 has its width dimension of a portion extending along the Y-axis direction set to be desirably the same as or shorter than the line width of the source line 19. On the other hand, the light shielding part 23 has its width dimension of a portion extending along the X-axis direction set to be larger than the line width of the gate line 18, and also has the center of its width direction (Y-axis direction) offset toward the lower side (drain electrode 16C side) shown in FIG. 4 relative to the line center of the gate line 18. The light shielding part 23 is disposed so as to overlap with almost the entire portion of the TFT 16 in addition to the gate line 18 and the source line 19.

Figure 5:
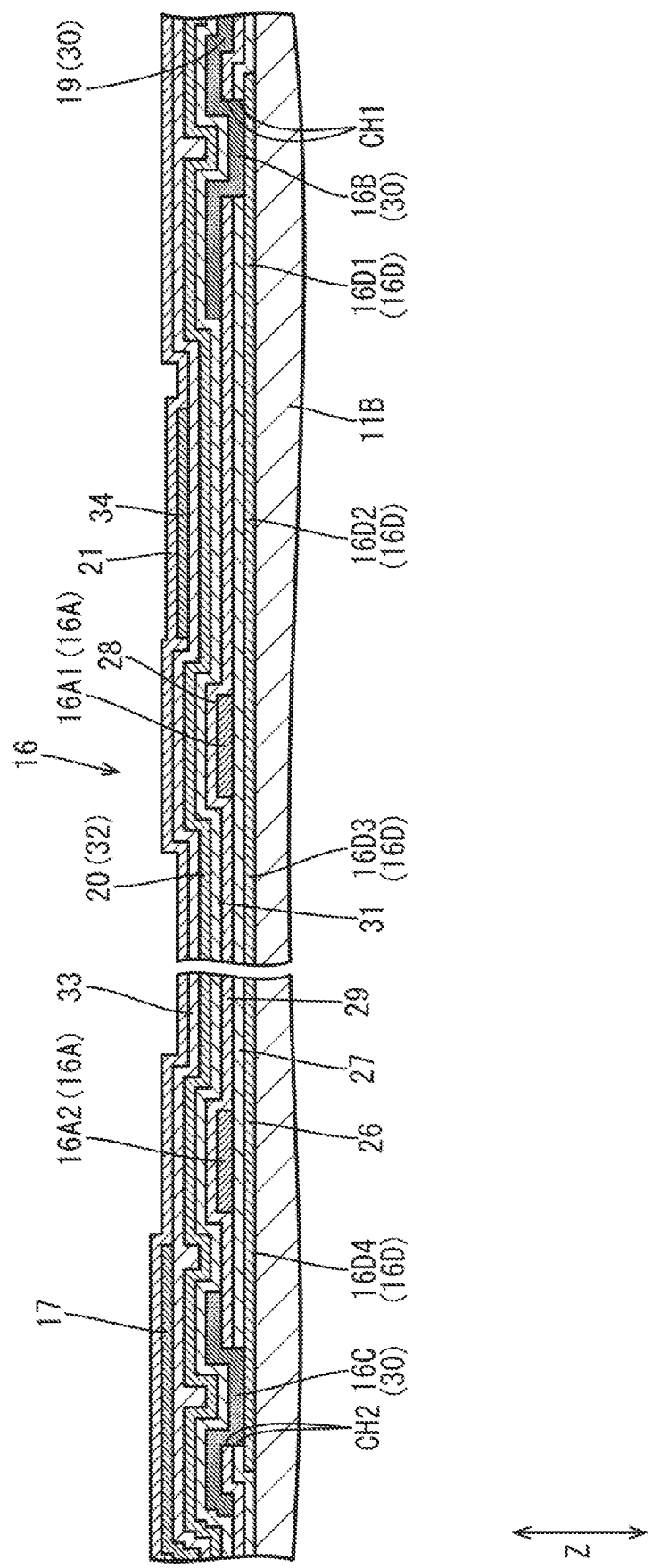
FIG. 5 is a cross-sectional view taken along line B-B of FIG. 4 in an array substrate of the liquid crystal panel.

Next, referring to FIG. 5, detailed explanation will be given on the specific stacking order or the like of the various films that are stacked and formed on the inner surface side of the array substrate 11B by using a known photolithography method or the like. FIG. 5 is a cross-sectional view formed by cutting the TFT 16 along the channel part 16D.

More specifically, as shown in FIG. 5, the array substrate 11B is formed by stacking at least the following films in the ascending order from the lowest layer: a semiconductor film 26, a first insulating film 27, a first metal film (gate metal film) 28, a second insulating film 29, a second metal film (source metal film) 30, a third insulating film 31, a first transparent electrode film 32, a fourth insulating film 33, a second transparent electrode film 34 and an array side alignment film 21. Of these films, the semiconductor film 26 is formed by being patterned into an island shape in accordance with the layout of the TFT 16 within the display area AA so as to constitute the channel part 16D. The semiconductor film 26 is made of a CG silicon (Continuous Grain Silicon) thin film, that is, one kind of polycrystallized silicon thin films (polycrystal silicon thin film). The CG silicon thin film is formed, for example, by adding a metal material to an amorphous silicon thin film and by carrying out a heating treatment on the resulting film at a low temperature of about 550° C. or less for a short period of time, and continuous properties are thus given to atomic arrangement in the crystal grain field of silicon crystal.

As shown in FIG. 5, the first insulating film 27, which is interposed between the semiconductor film 26 and the first metal film 28, is made of an inorganic material, such as silicon oxide, silicon nitride, or the like. The first metal film 28 is prepared as a stacked film made of stacked metal materials of different kinds, or a single layer film made of a metal material of one kind so as to form the gate line 18 and the gate electrode 16A of the TFT 16. The second insulating film 29, which is interposed between the first metal film 28 and the second metal film 30, is made of an inorganic material in the same manner as in the first insulating film 27. In the same manner as in the first metal film 28, the second metal film 30 is prepared as a stacked film or a single layer film so as to form the source line 19 and the source electrode 16B and the drain electrode 16C, etc. of the TFT 16. The intersecting portion between the source line 19 made of the second metal film 30 and the gate line 18 made of the first metal film 28 is maintained in an insulating state by the second insulating film 29 interposed therebetween. The third insulating film 31 is interposed between the second metal film 30 and the first transparent electrode film 32, and made of an inorganic material in the same manner as in the first insulating film 27 or the like. The first transparent electrode film 32 is made of, for example, a transparent electrode material, such as ITO or the like, and constitutes the common electrode 20 or the like. The fourth insulating film 33 is interposed between the first transparent electrode film 32 and the second transparent electrode film 34, and made of an inorganic material in the same manner as in the first insulating film 27 or the like. The second transparent electrode film 34 is made of a transparent electrode material in the same manner as in the first transparent electrode film 32, and constitutes the pixel electrode 17 and the like.

Referring to FIG. 4, explanation will be given in detail on a configuration of the TFT 16. In accordance with FIG. 4, the channel part 16D constituting the TFT 16 is bent four times in total so as to intersect with the gate line 18 two times while it proceeds from the source electrode 16B composed of one portion of the source line 19 serving as a connection target to the drain electrode 16C. More specifically, the channel part 16D is provided with a first channel constituting part (source area) 16D1 that extends in parallel with the source line 19 while overlapping with the source electrode 16B, and is then bent so as to extend along the X-axis direction toward the drain electrode 16C side serving as a connection target. The channel part 16D is provided with a second channel constituting part 16D2 that extends from the first channel constituting part 16D1 along the Y-axis direction so as to intersect with the gate line 18. The channel part 16D is provided with a third channel constituting part 16D3 that is bent from the second channel constituting part 16D2 so as to extend in the X-axis direction. The channel part 16D is provided with a fourth channel constituting part 16D4 that is bent from the third channel constituting part 16D3 so as to extend along the Y-axis direction and intersects with the gate line 18. Of the gate line 18, a portion that intersects with the second channel constituting part 16D2 is allowed to form a first gate electrode 16A1 forming the gate electrode 16A, and a portion intersecting with the fourth channel constituting part 16D4 is allowed to form a second gate electrode 16A2 forming the gate electrode 16A. That is, the TFT 16 has a double gate structure.

Figure 6:
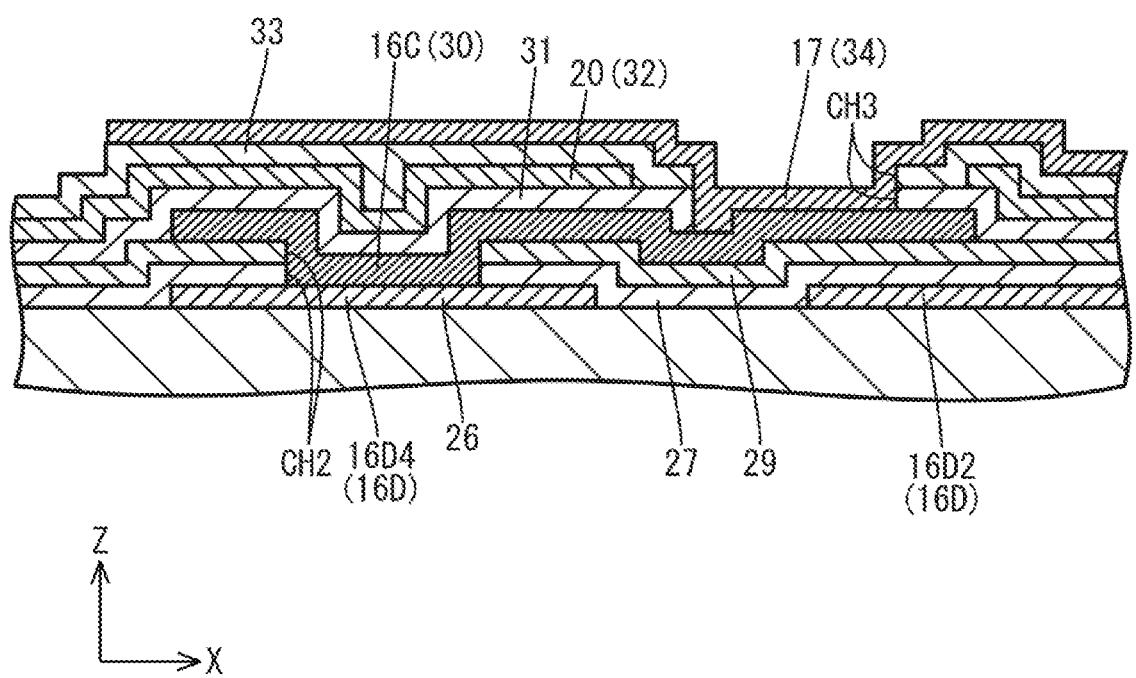
FIG. 6 is a cross-sectional view taken along line C-C of FIG. 4 in the array substrate of the liquid crystal panel.

As shown in FIG. 4, the fourth channel constituting part (drain region) 16D4 of the channel part 16D has its extending end part from the third channel constituting part 16D3 overlapped with the drain electrode 16C. On the other hand, the drain electrode 16C is disposed so as to overlap with both of the pixel electrode 17 serving as a connection target and the fourth channel constituting part 16D4 of the channel part 16D, and has a laterally long rectangular shape that extends along the X-axis direction. Of the first insulating film 27 and the second insulating film 29, at a position that overlaps with both of the first channel constituting part 16D1 and the source electrode 16B, a first contact hole CH1 is formed and opened, as shown in FIG. 5. Of the first insulating film 27 and the second insulating film 29, at a position that overlaps with both of the fourth channel constituting part 16D4 and the drain electrode 16C, a second contact hole CH2 is formed and opened. On the other hand, of the third insulating film 31 and the fourth insulating film 33, at a position that overlaps with both of the drain electrode 16C and the pixel electrode 17, a third contact hole CH3 is formed and opened. The channel part 16D has its first channel constituting part 16D1 connected to the source electrode 16B through the first contact hole CH1 and also has its fourth channel constituting part 16D4 connected to the drain electrode 16C through the second contact hole CH2 respectively. As shown in FIG. 6, the drain electrode 16C has its one end side connected to the fourth channel constituting part 16D4 of the channel part 16D through the second contact hole CH2 and its other end side connected to the pixel electrode 17 through the third contact hole CH3 respectively.

Figure 7:
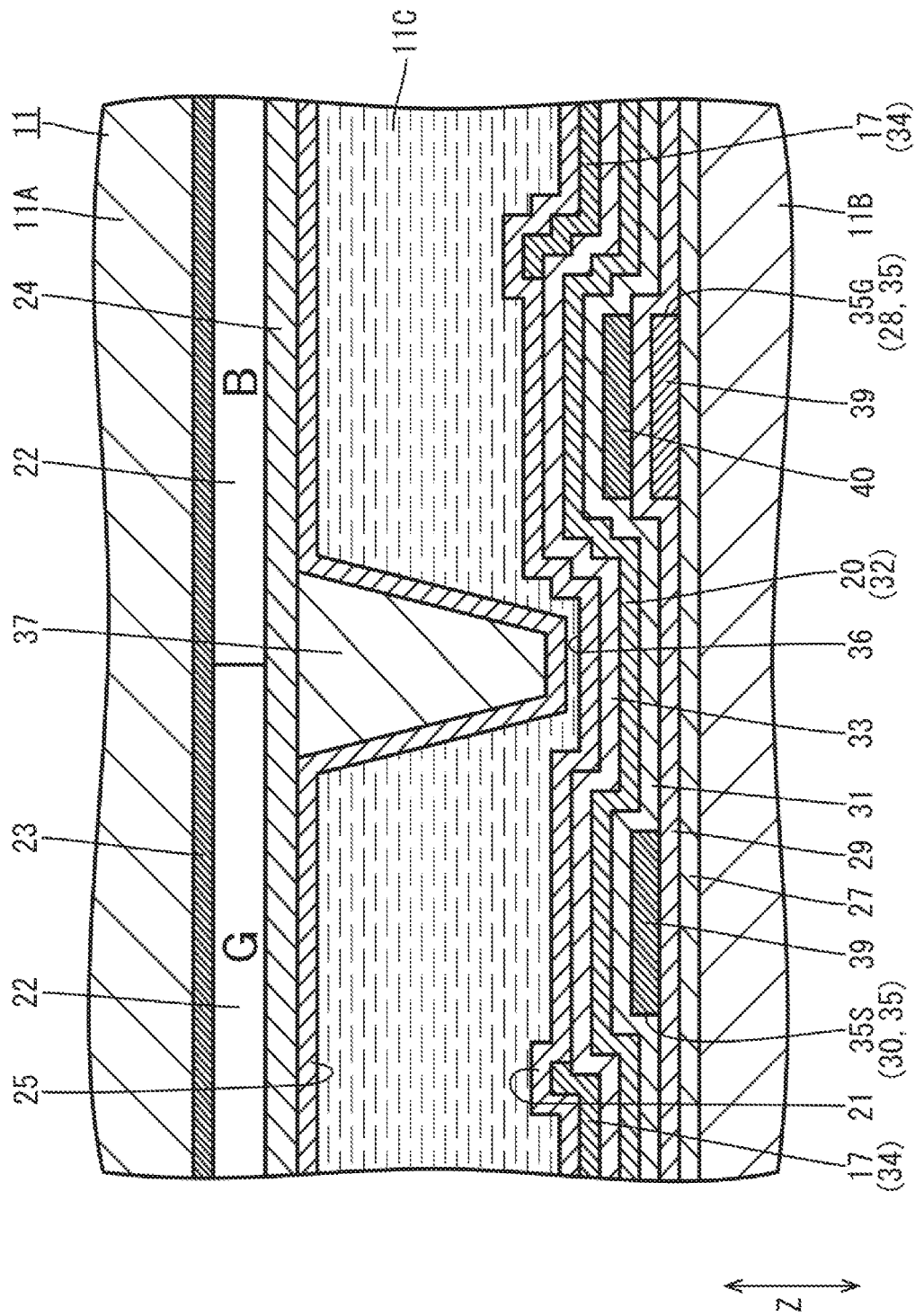
FIG. 7 is a cross-sectional view taken along line D-D of FIG. 4 in the liquid crystal panel.
Figure 8:
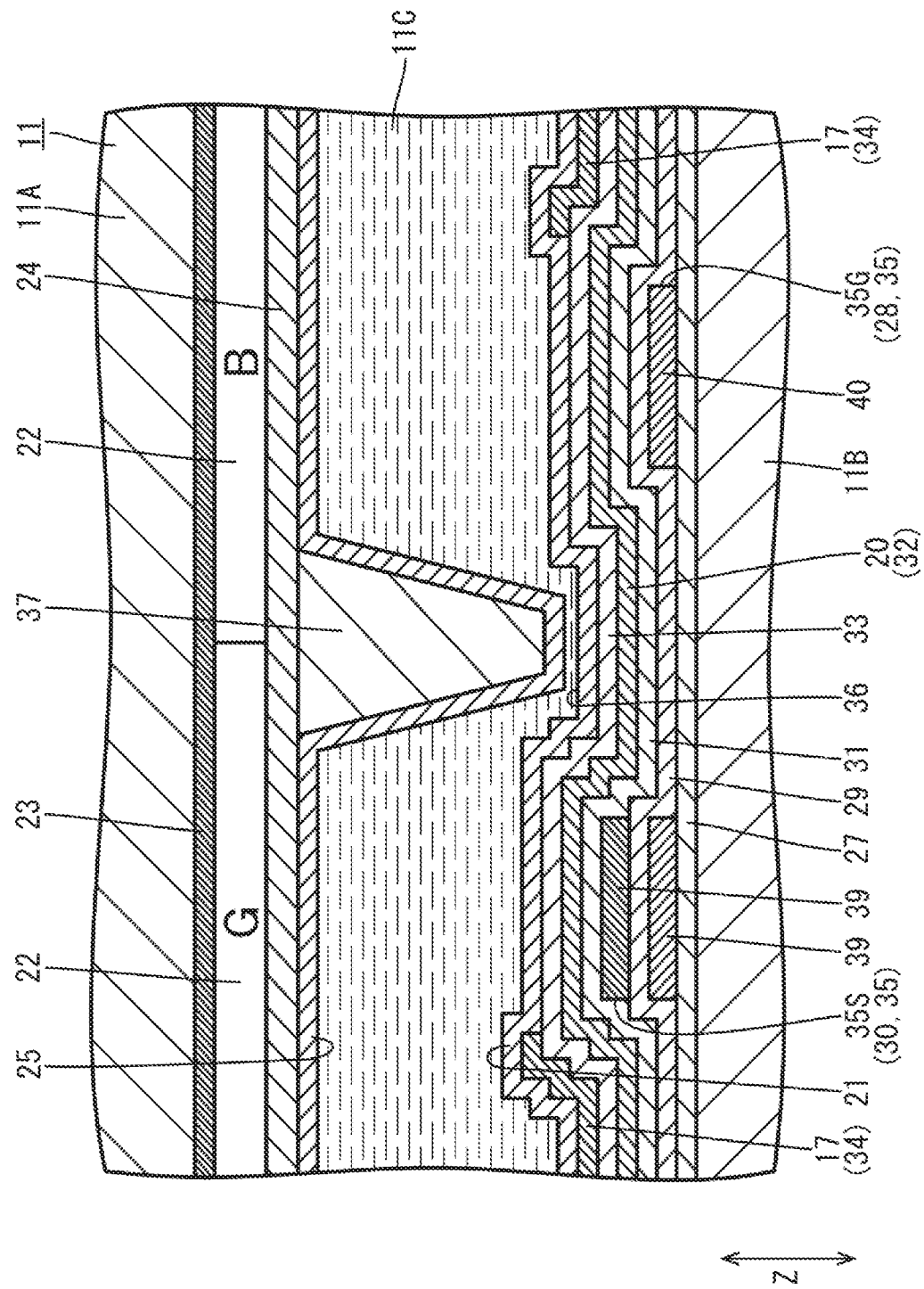
FIG. 8 is a cross-sectional view taken along line E-E of FIG. 4 in the liquid crystal panel.

In this case, referring to FIG. 4, FIG. 7 and FIG. 8, explanation will be given in detail on the gate line 18 and the source line 19 relating to the present embodiment. As shown in FIG. 4, the gate line 18 and the source line 19 have their intersecting portion at which they intersect with each other prepared as an annular line part 35 that forms an annular shape when seen in a plan view. On the center side of each of the annular line parts 35 of the gate line 18 and the source line 19, a concave part 36 having a concave shape is formed, and inside the concave part 36, a spacer (photo-spacer) 37 to be described later can be received. The concave part 36 has its uppermost surface (surface opposed to the spacer 37) lowered than the uppermost surface of each annular line part 35. As shown in FIG. 7 and FIG. 8, the spacer 37 is interposed between a pair of substrates 11A and 11B so that the thickness (cell gap, interval) of the liquid crystal layer 11C can be maintained at a fixed value (for example, about 3 μm). The spacer 37 protrudes through the liquid crystal layer 11C from the surface of the overcoat film 24 toward the array substrate 11B side in the display area AA of the CF substrate 11A, and its protruding tip end face is opposed to the inner surface (array side alignment film 21) of the array substrate 11B.

As shown in FIG. 4, the spacer 37 has a round shape in a plane shape, and is formed into a column shape as a whole. The spacer 37 is disposed so as to overlap with the concave part 36 of the annular line part 35 in the vicinity of an intersecting portion between the gate line 18 and the source line 19 when seen in a plan view, and is also disposed so as to overlap with the light shielding part 23 when seen in a plan view. The spacer 37 has a diameter dimension that is smaller than the diameter dimension of the concave part 36, and is always kept in an inserted state into the concave part 36, and its peripheral portion is surrounded by the annular line part 35. Therefore, even in the case when at the time of bonding the paired substrates 11A and 11B to each other, a positional deviation occurs in the direction along the plate surface, or in the case when an external force is exerted by, for example, a user by pushing the surface of the liquid crystal panel 11, since the spacer 37 inside the concave part 36 is surrounded by the annular line part 35 on its peripheral portion, it is hardly subjected to a positional deviation toward the outside of the concave part 36. Thus, by using the spacer 37, the interval between the paired substrates 11A and 11B is highly positively maintained so that the display quality is more desirably maintained. In the case when the spacer 37 is hardly subjected to a positional deviation, since the spacer 37 is avoided from sliding on the array side alignment film 21, the surface state of the array side alignment film 21 is hardly deteriorated, and consequently, an alignment regulating function relative to liquid crystal molecules is appropriately exerted by the array side alignment film 21. In particular, even in the case when the spacer 37 and the concave part 36 are miniaturized in accordance with progress of miniaturization and high precision, since the positional deviation of the spacer 37 can be appropriately regulated by the annular line part 35, it becomes possible to desirably achieve miniaturization and high precision. Moreover, since the annular line parts 35 are formed on both of the intersecting portions of the gate line 18 and the source line 19, the concave part 36 is formed into a non-line installation area having none of the gate line 18 and the source line 19 disposed therein. Therefore, in comparison with, for example, the case in which the annular line part is formed only on one of the intersecting portions of the gate line 18 and the source line 19, since the depth of the concave part 36 is ensured to become deeper, the spacer 37 to be received therein is more hardly subjected to a positional deviation by the annular line parts 35. Moreover, since the spacer 37 and the light shielding part 23 are disposed so as to overlap with each other, the spacer itself becomes hardly visible to the user, and display irregularities caused by alignment disturbances of the liquid crystal layer 11C around the spacer 37 also become hardly visible to the user.

Explanation will be given in detail on the configuration of the annular line part 35. As shown in FIG. 4, the annular line parts 35 are designed so that the intersecting portions of the gate line 18 and the source line 19 are respectively bent so as to detour the concave part 36, and the plane shape thereof is formed into a substantially ring shape (substantially, doughnut shape). Therefore, the concave part 36 is formed into a substantially round shape in its plane shape, and set to a shape similar to the plane shape of the spacer 37. The annular line part 35 and the concave part 36 have their centers substantially coincident with each other, and are disposed on the plane so as to be also substantially coincident with the centers of the respective lines of the gate line 18 and the source line 19. Moreover, the spacer 37 is disposed on the plane so as to make its center substantially coincident with the respective centers of the annular line part 35 and the concave part 36. The respective annular line parts 35 of the gate line 18 and the source line 19 are disposed so that their most portions overlap with each other when seen in a plan view, with the second insulating film 29 being interposed therebetween (see FIG. 7 and FIG. 8). The respective annular line parts 35 of the gate line 18 and the source line 19 are made to have the same width dimensions, and have the positions of their inner circumferential side ends (ends on the concave part 36 sides) and outer circumferential side ends (ends on the opposite side to the concave part 36 sides) set to substantially the same positions. Additionally, in the following description, in the case when the annular line parts 35 are distinguished from each other, that attached to the gate line 18 is referred to as "gate side annular line part" and has its reference numeral added with a subscript G, and that attached to the source line 19 is referred to as "source side annular line part" and has its reference numeral added with a subscript S, while in the case when they are generally referred to without being distinguished, no subscripts are added. The gate side annular line part 35G is installed on each of gate lines 18 at all the respective intersecting portions between the gate lines 18 and a large number of the source lines 19. In the same manner, the source side annular line part 35S is installed on each of source lines 19 at all the respective intersecting portions between the source lines 19 and a large number of the gate lines 18.

As shown in FIG. 4, each of the annular line parts 35 of the gate line 18 and the source line 19 has an annular shape with an end part, and between two end parts in a circumferential direction, an opening 38 is formed. More specifically, of the gate line 18 and the source line 19, portions other than the annular line parts 35 are prepared as the line main bodies 18A and 19A that extend linearly along the X-axis direction and the Y-axis direction, and to these line main bodies 18A and 19A, the annular line parts 35, each having an annular shape with an end part, are continuously connected. The annular line part 35 having an annular shape with an end part is composed of a stem line part 39 having two end parts connected to the line main bodies 18A and 19A, and a branch line part 40 having one of end parts connected to the same portion as the stem line part 39 of the line main body 18A or 19A. Therefore, it can be said that the annular line part 35 having an annular shape with an end part surrounds the concave part 36 and the spacer 37 within an angle range of more than 180° (more specifically, an angle range of about 270°). The stem line part 39 has its one of end parts connected to a portion that is not connected to the branch line part 40 of the line main body 18A or 19A, with its other end part being connected to a portion that is connected to the branch line part 40 of the line main body 18A or 19A. The branch line part 40 has its other end part on the opposite side to be connected to one of the end parts that is connected to the line main body 18A or 19A disposed so as to be opposed to one of the end parts of the stem line part 39, with the opening 38 being interposed therebetween so as not to be connected to the line main body 18A or 19A.

Of the array substrate 11B, a portion that overlaps with the opening 38 when seen in a plan view has its height of the uppermost surface (surface facing the liquid crystal layer 11C) made relatively lower than another portion that overlaps with the annular line part 35 when seen in a plan view, as shown in FIG. 7 and FIG. 8. In other words, of the peripheral surface of the concave part 36, although the uppermost surface of a portion surrounded by the annular line part 35 forms a high level portion, the uppermost surface of another portion that overlaps with the opening 38 forms a low level portion. In this case, when, after a deformation has occurred in at least one of the paired substrates 11A and 11B due to an external force exerted on the liquid crystal panel 11, it is restored, the spacer 37 is relatively displaced along the Z-axis direction (normal direction onto the plate surface of the two substrates 11A and 11B) relative to the array substrate 11B. During this process, since the spacer 37 is made in contact with the surface of the array substrate 11B, the interval between the two substrates 11A and 11B is maintained so as not to become further narrower. As the spacer 37 is relatively displaced relative to the array substrate 11B as described above, the volume of liquid crystal molecules of the liquid crystal layer 11C included inside the concave part 36 is fluctuated. At this time, the liquid crystal molecules of the liquid crystal layer 11C are allowed to pass through the above-mentioned low level portion by the opening 38 so that they are easily allowed to flow into the concave part 36 or flow out of the concave part 36. Thus, it becomes possible to shorten a period of time required from the deformation of the paired substrates 11A and 11B to the restoration. That is, high restoring property of the paired substrates 11A and 11B deformed by an external force can be ensured.

As shown in FIG. 4, the respective annular line parts 35 of the gate line 18 and the source line 19 are disposed so that the openings 38 are mutually kept in a non-overlapped state. The respective annular line parts 35 of the gate line 18 and the source line 19 are positionally deviated in mutually adjacent state in the X-axis direction, while each of the openings 38 being biasly located toward one side (lower side shown in FIG. 4) relative to the Y-axis direction. That is, the peripheral surface of the concave part 36 is set to the high level portion within about half the range (angle range of about 180°) relative to the peripheral direction, while the remaining about half the range is set to the low level portion. More specifically, the gate side annular line part 35G has its stem line part 39 overlapped with the source side annular line part 35S over substantially all the region, while most of the branch line part 40 except for one portion (protruding tip part from the stem line part 39) is disposed so as to be non-overlapped with the source side annular line part 35S. Of the gate side annular line part 35G, most of the branch line part 40 that is kept in the non-overlapped state with the source side annular line part 35S is disposed so as to overlap with the opening 38 of the source side annular line part 35S. The source side annular line part 35S has about half of its stem line part 39 overlapped with the gate side annular line part 35G, with the remaining portion being kept in the non-overlapped state with the gate side annular line part 35G, while almost the entire region of the branch line part 40 is disposed so as to overlap with the gate side annular line part 35G. Of the source side annular line part 35S, one portion (about half) of the stem line part 39 that is kept in the non-overlapped state with the gate side annular line part 35G is disposed so as to overlap with the opening 38 of the gate side annular line part 35G. In this manner, the gate side annular line part 35G is overlapped with the opening 38 of the source side annular line part 35S and the source side annular line part 35S is overlapped with the opening 38 of the gate side annular line part 35G; thus, these have a complementary relationship. Therefore, the concave part 36 is made to be surrounded by the respective annular line parts 35 of the gate line 18 and the source line 19 over the entire periphery so that the spacer 37 received by the concave part 36 is made to be more hardly positionally deviated by the respective annular line parts 35.

As shown in FIG. 4, the respective annular line parts 35 of the gate line 18 and the source line 19 have their openings 38 disposed to be made face to face with the drain electrode 16C side (opposite side to the third channel constituting part 16D3 side) of the TFT 16 relating to the Y-axis direction. On the other hand, as described earlier, the light shielding part 23 has its center of the portion extending along the gate line 18 offset toward the drain electrode 16C side of the TFT 16 with respect to the Y-axis direction, relative to the line center of the gate line 18. Therefore, it can be said that all the openings 38 of the respective annular line parts 35 are disposed so as to be directed to the center side of the light shielding part 23. In this case, the low level portion generated along the peripheral surface of the concave part 36 due to the aforementioned openings 38 makes the positional deviation regulating function of the spacer 37 locally lower, with the result that the spacer 37 inside the concave part 36 might be positionally deviated outward through the low level portion. However, the above-mentioned annular line part 35 has its opening 38 disposed so as to be directed to the center side of the light shielding part 23, that is, to the wider side of the light shielding range by the light shielding part 23; therefore, even in the case when the spacer 37 inside the concave part 36 is positionally deviated outward through the low level portion due to the opening 38, the positionally deviated spacer 37 becomes more positively disposed to be overlapped with the light shielding portion 23. Thus, the positionally deviated spacer 37 becomes hardly visible to a user.

As described above, the liquid crystal display device (display device) 10 of the present embodiment is provided with a pair of the substrates 11A and 11B so as to be opposed to each other with an interval therebetween, lines 18 and 19 installed on the array substrate (one of the substrates) 11B of the paired substrates 11A and 11B, the spacer 37 installed on a CF substrate (the other substrate) 11A so as to be interposed between the paired substrates 11A and 11B, and the annular line part 35 that is made of one portion of the line 18 or 19, and has an annular shape so as to form the concave part 36 for receiving the spacer 37 in the center side.

With this arrangement, the spacer 37 installed on the CF substrate 11A is interposed between the paired substrates 11A and 11B so that the interval between the paired substrates 11A and 11B is properly maintained. One portion of each of the lines 18 and 19 formed on the array substrate 11B is constituted as the annular line part 35 forming an annular shape having the concave part 36 for receiving the spacer 37 on the center side; therefore, even in the case when a positional deviation occurs in the paired substrates 11A and 11B or when an external force is exerted thereon, the spacer 37 is received by the inside the concave part 36 possessed on the center side of the annular line part 35 so that it is hardly positionally deviated toward the outside of the concave part 36. Thus, the interval between the paired substrates 11A and 11B is more positively maintained properly by the spacer 37 so that superior display quality is desirably ensured.

Moreover, the lines 18 and 19 include the gate line (first line) 18 and the source line (second line) 19 that is disposed on the upper layer side relative to the gate line 18 so as to intersect with the gate line 18, with the second insulating film (insulating film) 29 interposed therebetween, and the annular line part 35 is formed at least on one of the gate lines 18 and the source line 19, at an intersecting portion therebetween. The spacer 37 inherently tends to become a dark portion in the same manner as in the intersecting portion between the gate line 18 and the source line 19. Therefore, in comparison with, for example, the case in which the annular line part is formed on the non-intersecting portion between the gate line 18 and the source line 19, since the range of a dark point caused by the spacer 37 can be narrowed, thereby making it possible to maintain the aperture ratio high. Moreover, since the intersecting portion between the gate line 18 and the source line 19 is made to overlap with each other, with the second insulating film 29 interposed therebetween, by installing the annular line part 35 therein, the spacer 37 received by the concave part 36 is made to be more hardly subjected to a positional deviation.

Furthermore, the annular line part 35 may be formed on each of the intersecting portions of the gate line 18 and the source line 19. With this arrangement, since the concave part 36 is allowed to form a non-line installation area having none of the gate line and the source line 19 disposed therein. Therefore, in comparison with, for example, the case in which the annular line part is formed only on one of the intersecting portions of the gate line 18 and the source line 19, since the depth of the concave part 36 is ensured to become deeper, the spacer 37 to be received therein is more hardly subjected to a positional deviation by the annular line parts 35.

Moreover, at least either one of the annular line parts 35 of the gate line 18 and the source line 19 has an annular shape with end parts, with the opening 38 being placed between the two end parts. With this arrangement, since the opening 38 is formed between two end parts of the annular line part 35 having an annular shape with end parts, a low level portion is partially formed on the peripheral surface of the concave part 36. Therefore, for example, in the case when a liquid crystal layer (medium) 11C is present between the paired substrates 11A and 11B, even if the paired substrates 11A and 11B are deformed due to the application of an external force, since liquid crystal molecules of the liquid crystal layer 11C are allowed to easily flow into the concave part 36 from the above-mentioned low level portion, it is possible to shorten a period of time required from the deformation of the paired substrates 11A and 11B to the restoration.

Moreover, of the gate line 18 and the source line 19, that having the annular line part 35 having an annular shape with end parts is provided with the line main bodies 18A or 19A that is continuously connected to the annular line parts 35 having an annular shape with end parts, and the annular line part 35 having an annular shape with end parts is composed of a stem line part 39 having two end parts connected to the line main bodies 18A and 19A, and a branch line part 40 having one of end parts connected to the same portion as the stem line part 39 of the line main body 18A or 19A. With this arrangement, the annular line part 35 constituted by the stem line part 39 and the branch line part 40 surrounds the concave part 36 with an angle range of 180° or more. Thus, the spacer 37 received by the concave part 36 is made to be more hardly subjected to a positional deviation.

Furthermore, on the CF substrate 11A, the light shielding part 23, which is overlapped with at least one of the gate line 18 and the source line 19 and has its center portion offset relative to the center of at least one of the gate line 18 and the source line 19 serving as the overlapping target, is installed, and the annular line part 35 is disposed so that the opening 38 is directed to the center side of the light shielding part 23. When a partially low level portion is formed on the peripheral surface of the concave part 36 due to the opening 38, the spacer 37 inside the concave part 36 might be positionally deviated outward through the low level portion.

In this point, since the annular line part 35 has its opening 38 disposed so as to be directed to the center side of the light shielding part 23, that is, so as to be directed to a wider side of the light shielding range by the light shielding part 23, even when the spacer 37 inside the concave part 36 is positionally deviated outward through the low level portion, the positionally deviated spacer 37 is highly positively disposed so as to overlap with the light shielding part 23. Thus, the positionally deviated spacer 37 is made to be hardly visible by the user.

Moreover, both of the source side annular line parts 35S of the gate line 18 and the source line 19 have an annular shape with ends, with openings 38 being made in a non-overlapped state. With this arrangement, such a relationship is provided in which the gate side annular line part 35G of the gate line 18 is overlapped with the opening 38 of the source side annular line part 35S of the source line 19, while the source side annular line part 35S of the source line 19 is overlapped with the opening 38 of the gate side annular line part 35G of the gate line 18. Therefore, since the concave part 36 is surrounded by the source side annular line part 35S of the gate line 18 and the source line 19 over the entire periphery thereof, the spacer 37 received by the concave part 36 is made to be hardly positionally deviated by the two annular line parts 35.

Furthermore, the gate line 18 and the source line 19 have the positions of their end parts on the concave part 36 side of the annular line parts 35 mutually aligned. With this arrangement, in comparison with, for example, the case in which the positions of the end parts on the concave part 36 side of the annular line parts become irregular, the peripheral surface of the concave part 36 becomes steeper. Thus, the spacer 37 received by the concave part 36 is made to be more hardly positionally deviated.

Second Embodiment

Figure 9:
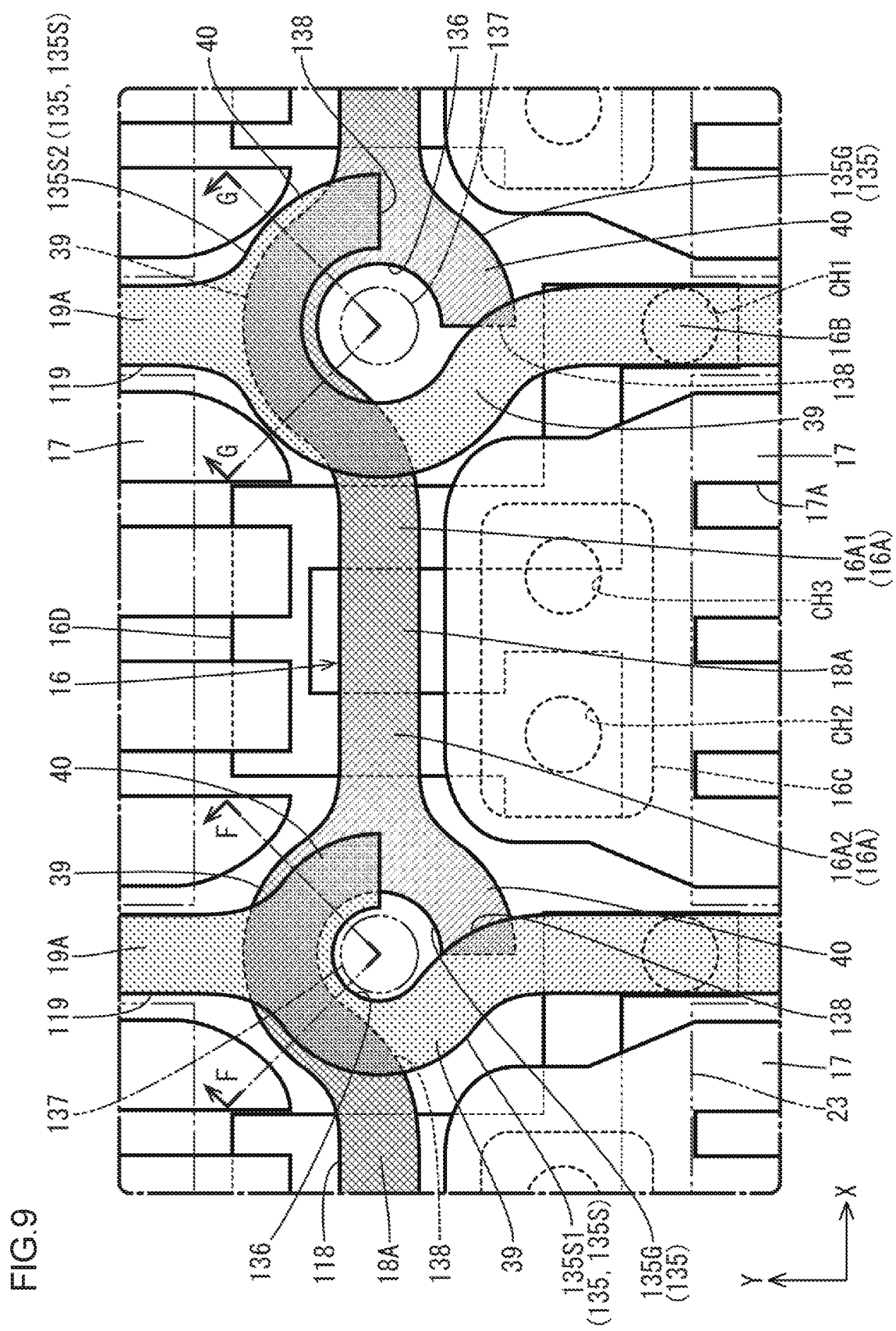
FIG. 9 is a plan view that shows the vicinity of a TFT in an enlarged manner in a display area of a liquid crystal panel in accordance with a second embodiment.
Figure 10:
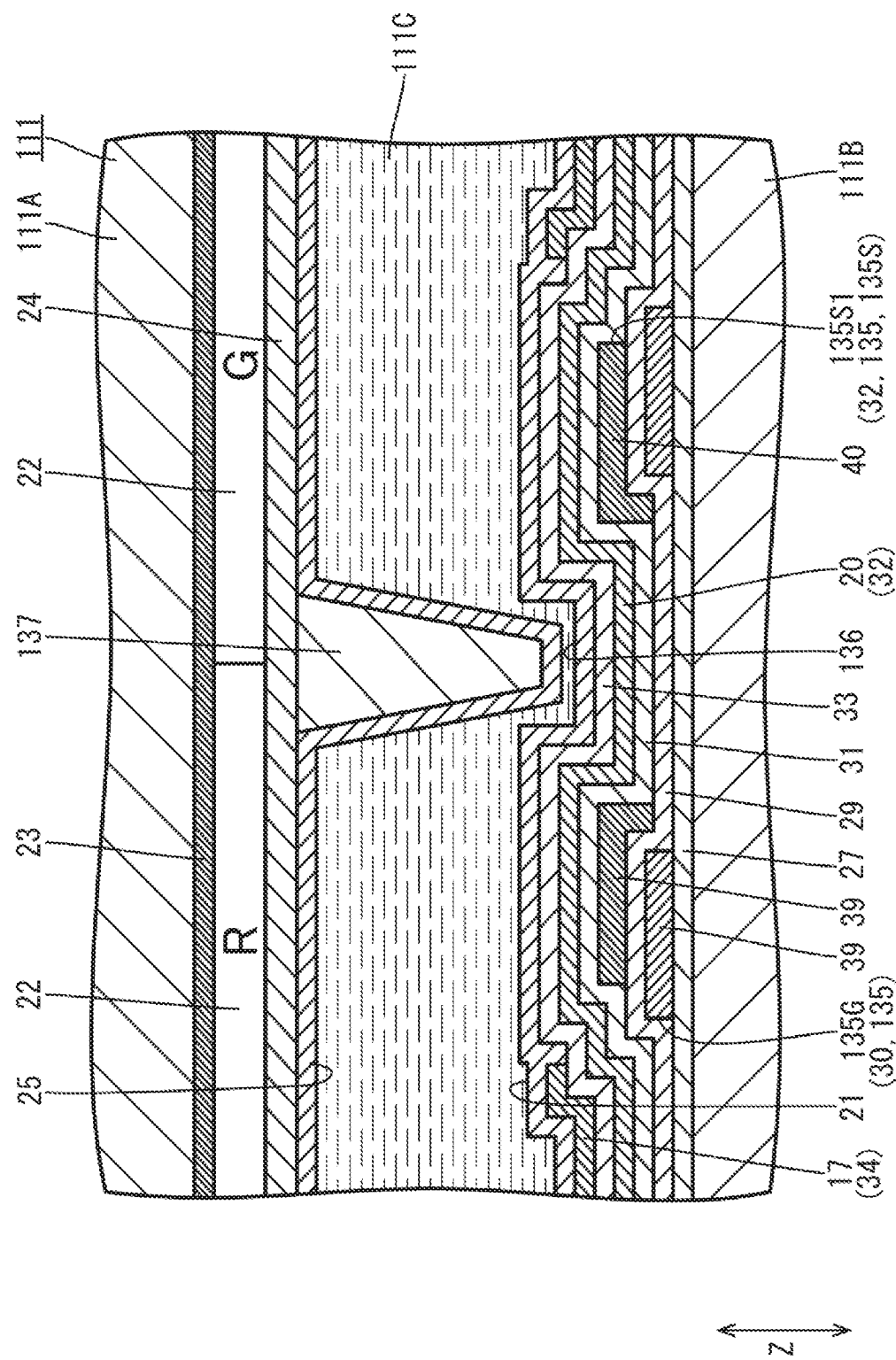
FIG. 10 is a cross-sectional view taken along line F-F of FIG. 9 in the liquid crystal panel.
Figure 11:
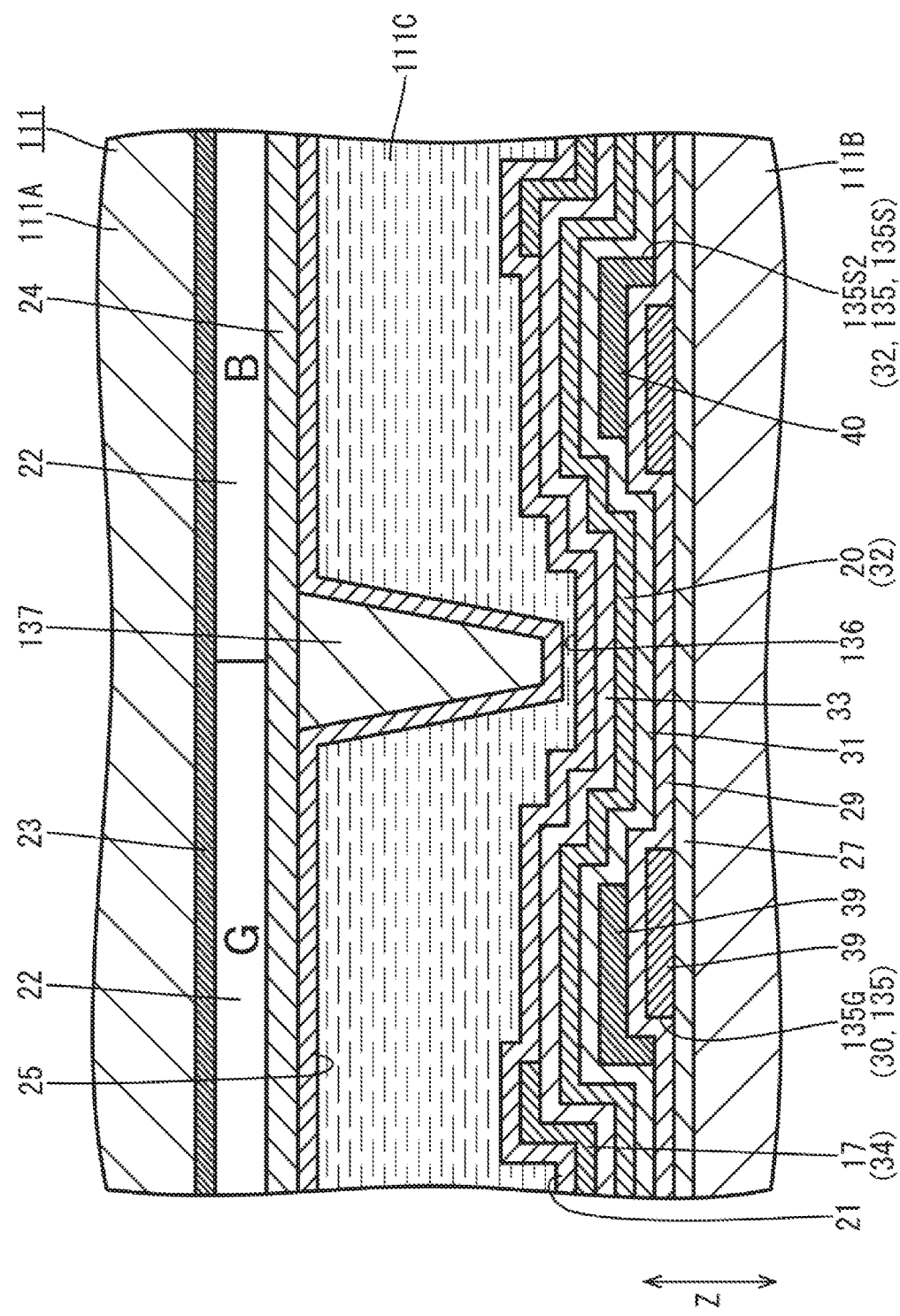
FIG. 11 is a cross-sectional view taken along line G-G of FIG. 9 in the liquid crystal panel.

Referring to FIG. 9 to FIG. 11, explanation will be given on the second embodiment. The second embodiment exemplifies a case in which the configuration of a source side annular line part 135S is altered. Additionally, with respect to the configuration, function and effect that are the same as those in the aforementioned first embodiment, overlapped explanations will be omitted.

As shown in FIG. 9, the source side annular line part 135S serving as a annular line part 135 related to the present embodiment is disposed so as to partially overlap with a concave part 136 and a spacer 137 in a radial direction relative to a gate side annular line part 135G. Moreover, the source side annular line part 135S includes two kinds of line parts, that is, a first source side annular line part 135S1 having a relatively small radial dimension and a second source side annular line part 135S2 having a relatively large radial dimension. Of these, as shown in FIG. 9 and FIG. 10, a first source side annular line part 135S1 has its inner peripheral side portion disposed on an inner side than the gate side annular line part 135G, although the outer peripheral side portion is disposed to be overlapped with the inner peripheral side portion of the gate side annular line part 135G. That is, the first source side annular line part 135S1 is offset toward a concave part 136 side while being partially overlapped with the gate side annular line part 135G. On the other hand, as shown in FIG. 9 and FIG. 11, a second source side annular line part 135S2 has its outer peripheral side portion disposed on an outer side than the gate side annular line part 135G, although the inner peripheral side portion is disposed to be overlapped with the outer peripheral side portion of the gate side annular line part 135G. That is, the second source side annular line part 135S2 is partially overlapped with the gate side annular line part 135G, while it is offset toward the side opposite to the concave part 136 side.

In accordance with the above-mentioned configuration, as shown in FIG. 10, the first source side annular line part 135S1 has the opening range (diameter dimension) of its concave part 136 relative to the spacer 137 made to be narrower (smaller) than that of the second source side annular line part 135S2. Therefore, in the case when an external force is exerted by, for example, a user by pushing the surface of a liquid crystal panel 111, since the spacer 137 inside the concave part 136 of the first source side annular line part 135S1 is made in contact with the surface (peripheral surface of the concave part 136) of an array substrate 111B in a comparatively earlier stage so that the substrate interval holding function is exerted. In contrast, as shown in FIG. 11, the second source side annular line part 135S2 has the opening range (diameter dimension) of its concave part 136 relative to the spacer 137 made to be wider (larger) than that of the first source side annular line part 135S1. Therefore, in the case when an external force is exerted by, for example, a user by pushing the surface of a liquid crystal panel 111, since the spacer 137 inside the concave part 136 of the second source side annular line part 135S2 is made in contact with the surface of an array substrate 111B in a comparatively later stage so that the substrate interval holding function is exerted. In this manner, in the case when the external force is exerted, the spacer 137 entered inside the concave part 136 of the first source side annular line part 135S1 and the spacer 137 entered inside the concave part 136 of the second source side annular line part 135S2 are allowed to exert the substrate interval holding function at different timings one after another so that resistance to the application of a large external force can be obtained. Moreover, in the same manner as in the aforementioned first embodiment, since each of the first source side annular line part 135S1 and the second source side annular line part 135S2 has an annular shape with end parts and has an opening 138, at the time of removing the above-mentioned external force, the liquid crystal material of the liquid crystal layer 111C is made to easily flow into the concave part 136. Thus, it becomes possible to shorten a period of time required from the deformation of the paired substrates 111A and 111B to the restoration. Moreover, with respect to the spacer 137, all the heights can be set to the same; therefore, for example, in comparison with a case in which the heights are made different from each other, the manufacturing costs can be reduced. Moreover, by patterning the gate line 118 and the source line 119 serving as the structural object on the array substrate 111B side, the timings in which the spacer 137 having the uniform height are allowed to exert the substrate interval holding function can be made different one after another; therefore, it becomes not necessary to design the CF substrate 111A into a special shape, thereby reducing the manufacturing costs.

As described above, in accordance with the present embodiment, in the gate line 118 and the source line 119, the source side annular line part 135S of the source line 119 is partially overlapped with the gate side annular line part 135G of the gate line 118, and disposed on the concave part 136 side. With this configuration, for example, in comparison with a case in which the source side annular line part of the source line 119 is disposed on a side opposite to the concave part 136 side relative to the gate side annular line part of the gate line 118, the opening range of the concave part 136 relative to the spacer 137 becomes narrower. Therefore, in the case when an external force is exerted, the substrate interval holding function by the spacer 137 can be exerted in a comparatively earlier stage.

Moreover, in the gate line 118 and the source line 119, the source side annular line part 135S of the source line 119 is partially overlapped with the gate side annular line part 135G of the gate line 118, and disposed on a side opposite to the concave part 136 side. With this configuration, for example, in comparison with a case in which the source side annular line part of the source line 119 is disposed on the concave part 136 side relative to the gate side annular line part of the gate line 118, the opening range of the concave part 136 relative to the spacer 137 becomes wider. Therefore, in the case when an external force is exerted, the substrate interval holding function by the spacer 137 can be exerted in a comparatively later stage.

Third Embodiment

Figure 12:
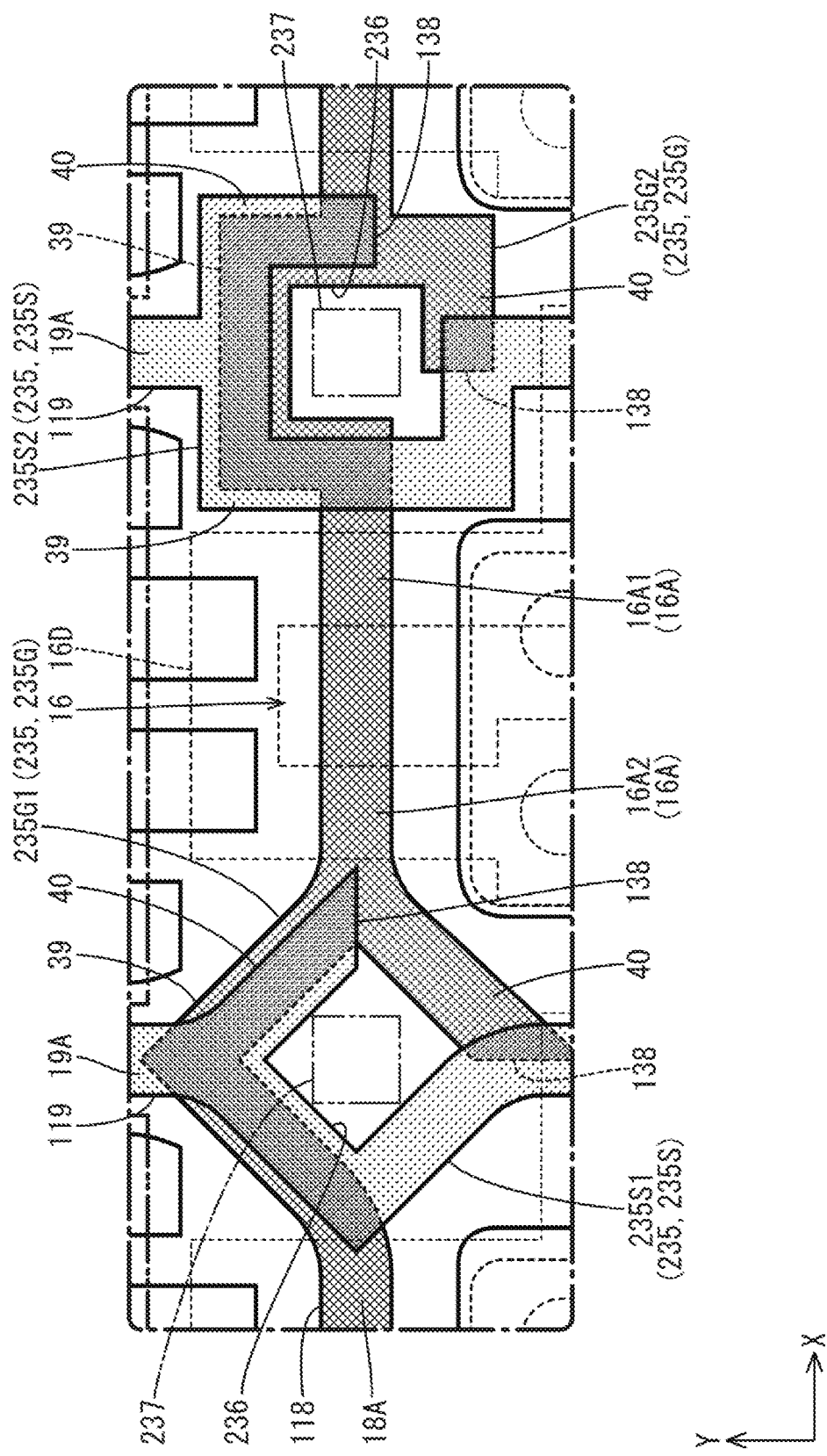
FIG. 12 is a plan view that shows the vicinity of a TFT in an enlarged manner in a display area of a liquid crystal panel in accordance with a third embodiment.

Referring to FIG. 12, explanation will be given on the third embodiment. The third embodiment exemplifies a case in which from the above-mentioned second embodiment, the plane shapes of the annular line part 235 and spacer 237 are altered. Additionally, with respect to the configuration, function and effect that are the same as those in the aforementioned second embodiment, overlapped explanations will be omitted.

As shown in FIG. 12, the annular line part 235 relating to the present embodiment includes one having an annular shape with a rhombus shape when seen in a plan view and another one having an annular shape with a rectangular shape (square shape) when seen in a plan view. A first source side annular line part 235S1 serving as a source side annular line part 235S has an annular shape with a rhombus shape when seen in a plan view and a first gate side annular line part 235G1 serving as a gate side annular line part 235G that is overlapped therewith also has an annular shape with a rhombus shape when seen in a plan view. A second source side annular line part 235S2 has an annular shape with a rectangular shape when seen in a plan view and a second gate side annular line part 235G2 serving as a gate side annular line part 235G that is overlapped therewith also has an annular shape with a rectangular shape when seen in a plan view. In contrast, any of spacers 237 have a rectangular shape when seen in a plan view. Therefore, the first source side annular line part 235S1 and the first gate side annular line part 235G1 have plane shapes of their concave parts 236 made to be non-similar shape to the plane shape of the spacer 237. On the other hand, the second source side annular line part 235S2 and the second gate side annular line part 235G2 have plane shapes of their concave parts 236 made to be similar to the plane shape of the spacer 237.

In accordance with the above-mentioned arrangement, when an external force is exerted, the rectangular shaped spacer 237 entered inside the concave part 236 of the first source side annular line part 235S1 is made in point-contact with the peripheral surface of the rhombus shaped concave part 236 when seen in a plan view in a comparatively earlier stage. Therefore, in the case when the exerted external force is an instantaneous one, the deformation of the paired substrates (not shown in the present embodiment) is restored in a short period of time. On the other hand, in the case when the external force is continuously exerted, the contact area of the spacer 237 to the peripheral surface of the concave part 236 gradually increases in accordance with the elapsed time so that the substrate interval holding function is gradually strengthened; thus, the deformation of the paired substrates due to the exerted external force can be desirably suppressed. On the other hand, when an external force is exerted, the rectangular shaped spacer 237 entered inside the concave part 236 of the second source side annular line part 235S2 is made linearly in contact with the peripheral surface of the rectangular shaped concave part 236 when seen in a plan view in a comparatively later stage. Therefore, a high substrate interval holding function can be exerted from the initial stage at which the spacer 237 is made in contact with the peripheral surface of the concave part 236 so that the deformation of the paired substrates due to the exerted external force can be desirably suppressed.

As described above, in accordance with the present embodiment, the annular line part 235 has the plane shape of its concave part 236 made to be non-similar to the plane shape of the spacer 237. With this arrangement, in the case when an external force is exerted onto the paired substrates, the spacer 237 is first made in point-contact with the peripheral surface of the concave part 236 when seen in a plan view. Therefore, when the external force is an instantaneous one, the deformation of the paired substrates can be restored in a short period of time. On the other hand, in the case when the external force is continuously exerted, since the contact area of the spacer 237 to the peripheral surface of the concave part 236 can be gradually increased in accordance with the elapsed time, the deformation of the paired substrates due to the exerted external force can be suppressed.

Moreover, the annular line part 235 has the plane shape of its concave part 236 made to be similar to the plane shape of the spacer 237. With this arrangement, in the case when an external force is exerted onto the paired substrates, the spacer 237 is made linearly in contact with the peripheral surface of the concave part 236 when seen in a plan view. Since the spacer 237 exerts the substrate interval holding function in a comparatively later stage, when an external force is exerted, it becomes possible to desirably suppress the deformation of the paired substrates due to the exerted external force.

Fourth Embodiment

Figure 13:
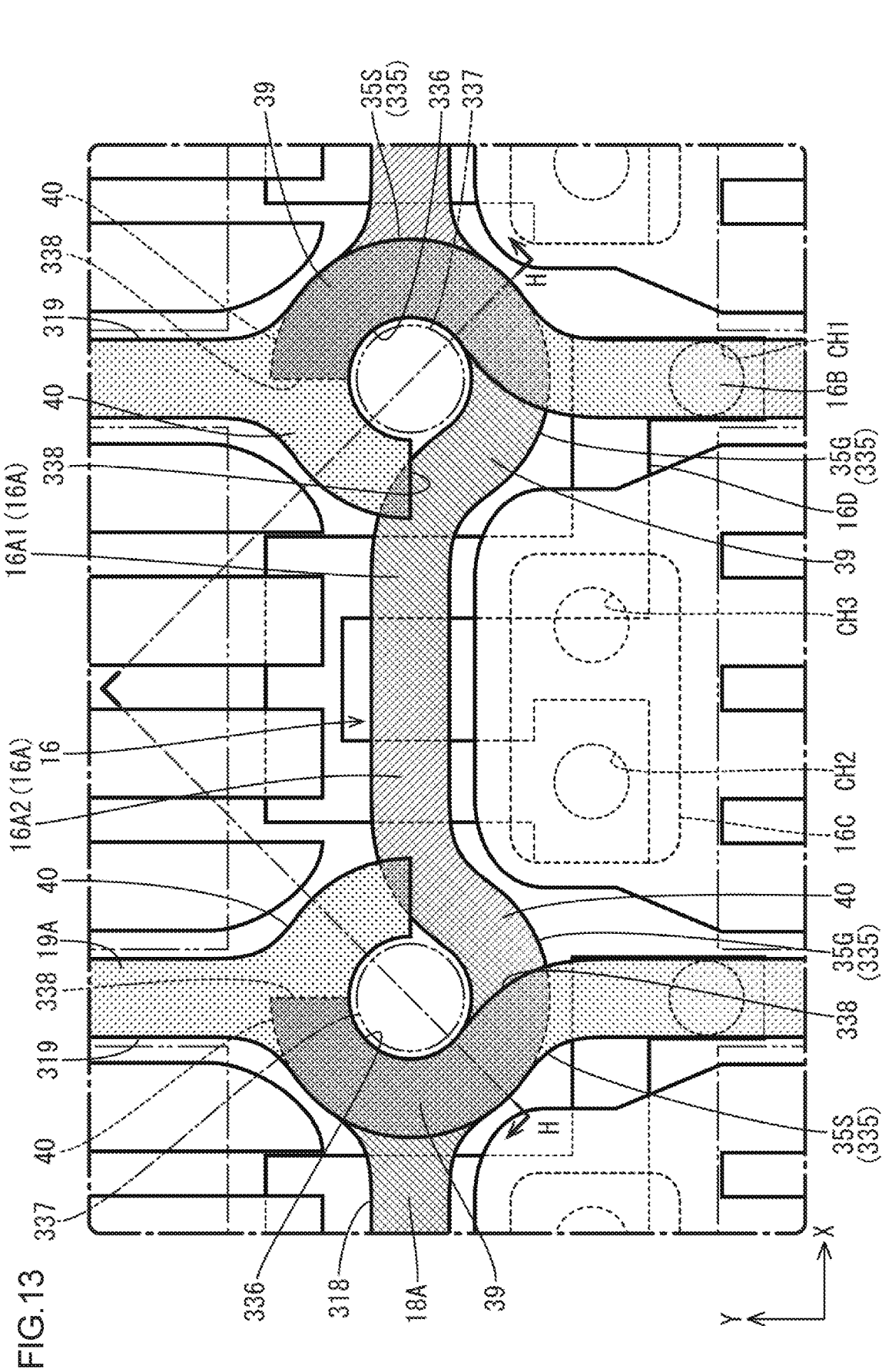
FIG. 13 is a plan view that shows the vicinity of a TFT in an enlarged manner in a display area of a liquid crystal panel in accordance with a fourth embodiment.
Figure 14:
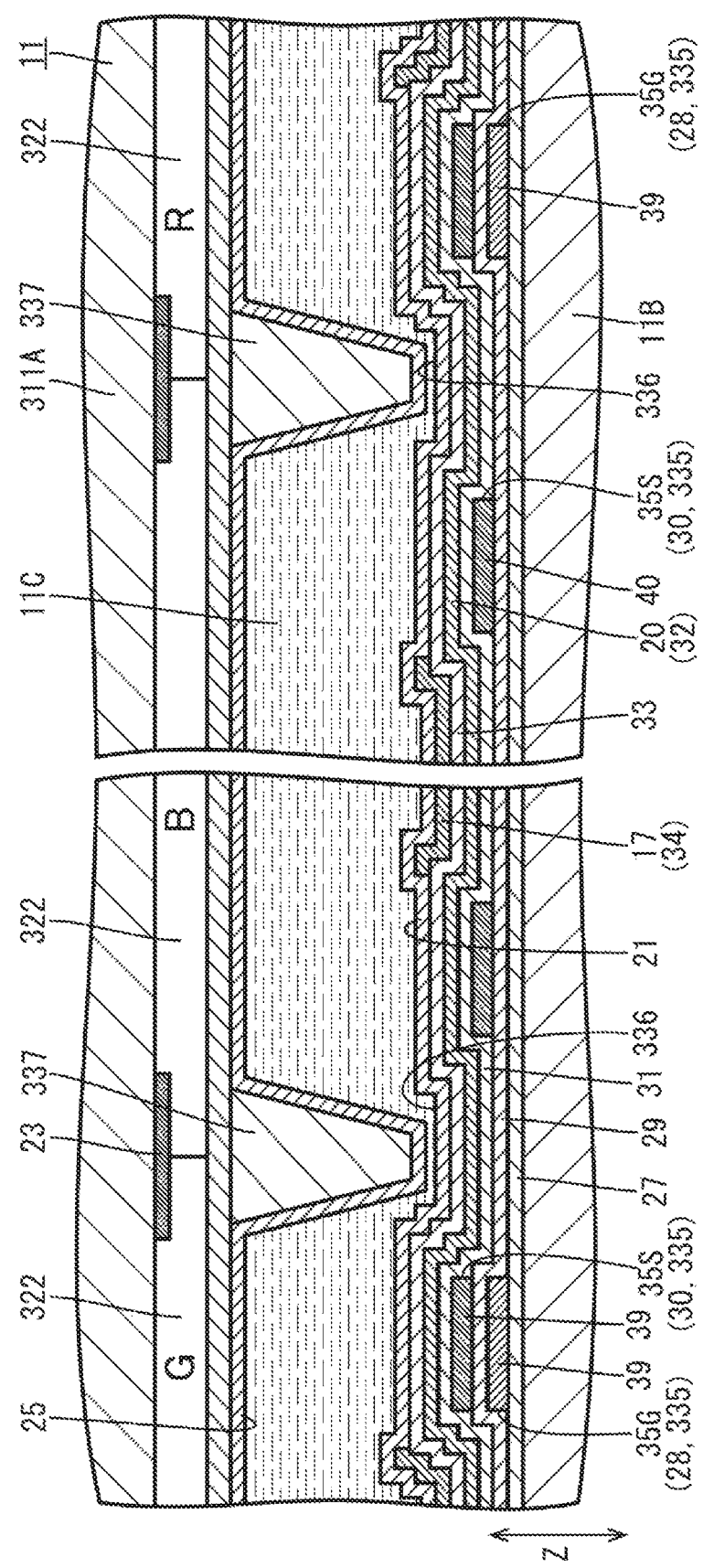
FIG. 14 is a cross-sectional view taken along line H-H of FIG. 13 in the liquid crystal panel.

Referring to FIG. 13 or FIG. 14, explanation will be given on the fourth embodiment. The fourth embodiment exemplifies a case in which from the above-mentioned first embodiment, the configuration of an annular line part 335 is altered. Additionally, with respect to the configuration, function and effect that are the same as those in the aforementioned first embodiment, overlapped explanations will be omitted.

As shown in FIG. 13, the annular line part 335 of the present embodiment has its opening 338 biased toward one side (right side or left side in FIG. 4) in the X-axis direction, while being made adjacent to another one in the Y-axis direction. Moreover, in the CF substrate 311A, annular line parts 335, which are installed respective intersecting portions of a pair of source line 319 and gate line 318 that sandwich a pixel electrode 317 overlapped with a color filter 322 that exerts blue color having the lowest visual sensitivity, have their openings 338 disposed so as to be directed to the color filter 322 that exerts blue color and the pixel electrode 317 that overlaps therewith, as shown in FIG. 13 and FIG. 14. More specifically, the annular line part 335, which is adjacent to the left side of each of the drawings relative to the color filter 322 exerting blue color, is formed so as to make the opening 338 to face rightward, and in contrast, the annular line part 335, which is adjacent to the right side of each of the drawings relative to the color filter 322 exerting blue color, is formed so as to make the opening 338 to face leftward. The spacer 337 inserted inside the concave part 336 of the annular line part 335 might be positionally deviated outside of the concave part 336 through the low level portion that overlaps with the opening 338 of the peripheral surface of the concave part 336 due to the exerted external force. Even in that case, the spacer 337 that has been positionally deviated outside of the concave part 336 is disposed to overlap with the color filter 322 that exerts blue color having the lowest visual sensitivity, but not to overlap with the color filter 322 that exerts green color and red color having higher visual sensitivity than the color filter 322 that exerts blue color. Thus, display irregularities caused by the spacer 337 are made to become hardly visible so that degradation in display quality can be suppressed.

As explained above, in accordance with the present embodiment, on the CF substrate 311A, a plurality of color filters 322 that exert different colors are disposed in parallel with each other, and either one of the gate line 318 and the source line 319 is disposed on a plane so as to partition the plural color filters 322 that exert the different colors, and the annular line part 335 is disposed so as to make the opening 338 to be directed to the color filter 322 side having relatively low visual sensitivity of the adjacent color filters 322. In the case when a partially low level portion is generated on the peripheral surface of the concave part 336 due to the opening 338, the spacer 337 inside the concave part 336 might be positionally deviated outside through the low level portion. However, the annular line part 335 is disposed so as to make the opening 338 to be directed to the color filter 322 side having relatively low visual sensitivity of the adjacent color filters 322; therefore, even when the spacer 337 inside the concave part 336 is positionally deviated outward through the low level portion, the positionally deviated spacer 337 is more highly positively disposed so as to overlap with the color filter 322 having relatively low visual sensitivity. Thus, the positionally deviated spacer 337 is made to be hardly visible to a user.

Fifth Embodiment

Figure 15:
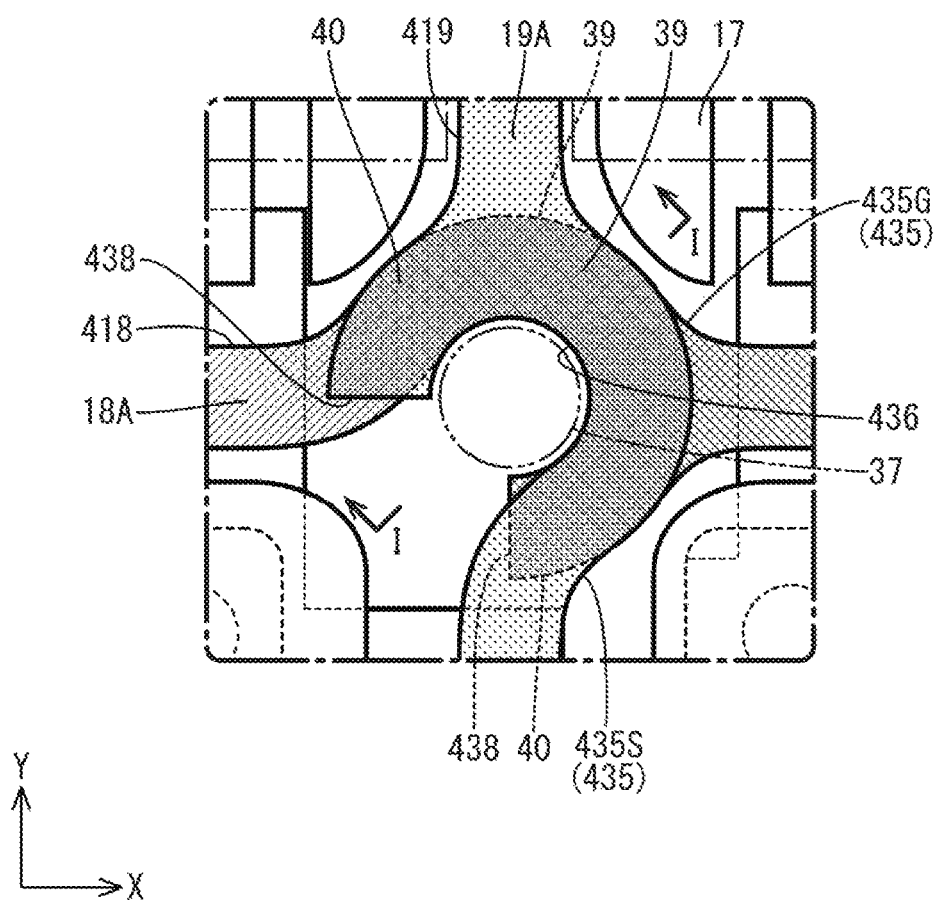
FIG. 15 is a plan view that shows the vicinity of a TFT in an enlarged manner in a display area of a liquid crystal panel in accordance with a fifth embodiment.
Figure 16:
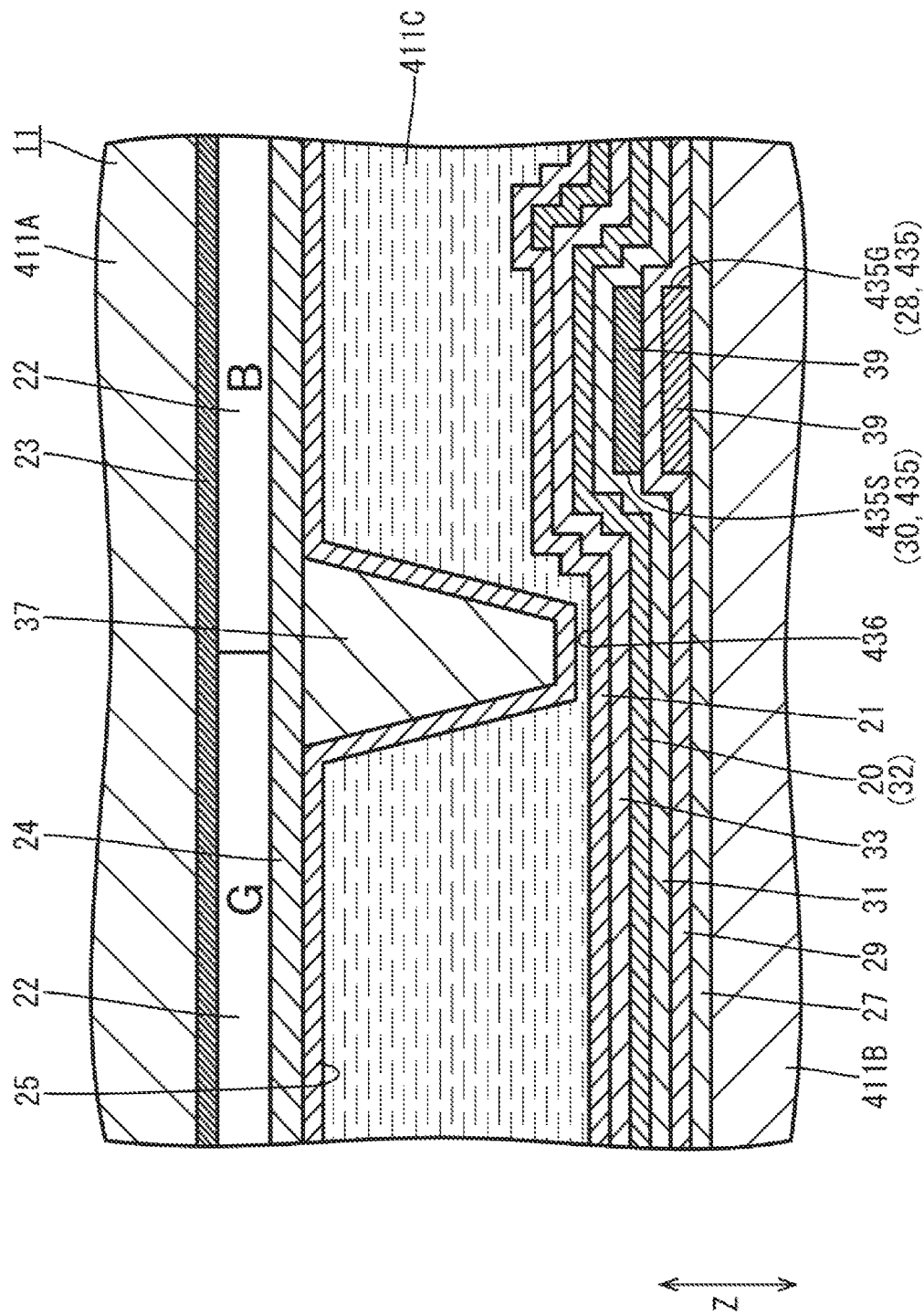
FIG. 16 is a cross-sectional view taken along line I-I of FIG. 15 in the liquid crystal panel.

Referring to FIG. 15 or FIG. 16, explanation will be given on a fifth embodiment. The fifth embodiment exemplifies a case in which from the above-mentioned first embodiment, the configuration of an annular line part 435 is altered. Additionally, with respect to the configuration, function and effect that are the same as those in the aforementioned first embodiment, overlapped explanations will be omitted.

As shown in FIG. 15 and FIG. 16, a gate side annular line part 435G and a source side annular line part 435S included in the annular line part 435 related to the present embodiment are disposed so as to make their openings 438 to overlap with each other. In other words, the gate side annular line part 435G and the source side annular line part 435S are disposed so as to overlap with each other over substantially all the periphery thereof when seen in a plan view, with the respective openings 438 being coincident with each other in the peripheral direction. Therefore, the peripheral surface of the concave part 436 has its about ¾ of range in the peripheral direction (angle range of about 270°) formed as a high level portion, and has its about ¼ of range (angle range of about) 90° formed as a low level portion. In comparison with the low level portion described in the aforementioned first embodiment, the low level portion of these has its step difference alleviated so that bubbles are hardly generated in the liquid crystal layer 411C due to the step difference.

As explained above, in accordance with the present embodiment, both of the annular line parts 435 of the gate line 418 and the source line 419 have an annular shape with an end part, with their openings 438 being mutually overlapped with each other. With this arrangement, since the openings 438 of the annular line parts 435 of the gate line 418 and the source line 419 are overlapped with each other, a step difference is hardly generated at positions of the array substrate 411B to be overlapped with the openings 438. Thus, for example, even in the case when the liquid crystal layer 411C is present between the paired substrates 411A and 411B, bubbles are hardly generated in the liquid crystal layer 411C due to the step difference.

Embodiment 6

Figure 17:
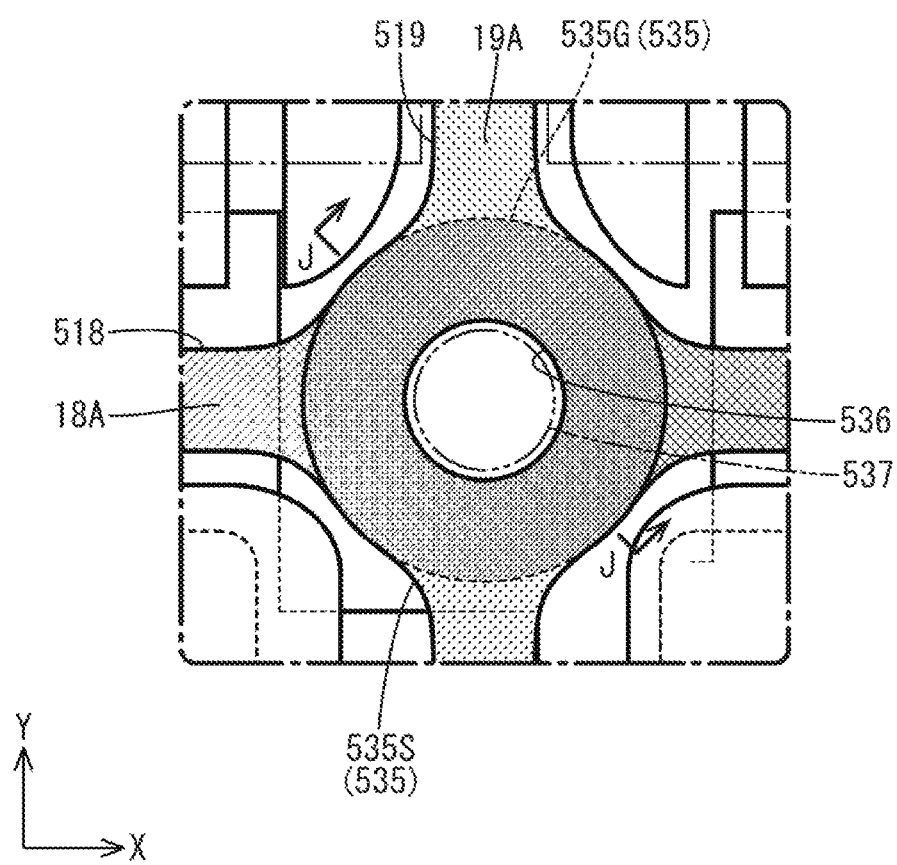
FIG. 17 is a plan view that shows the vicinity of a TFT in an enlarged manner in a display area of a liquid crystal panel in accordance with a sixth embodiment.
Figure 18:
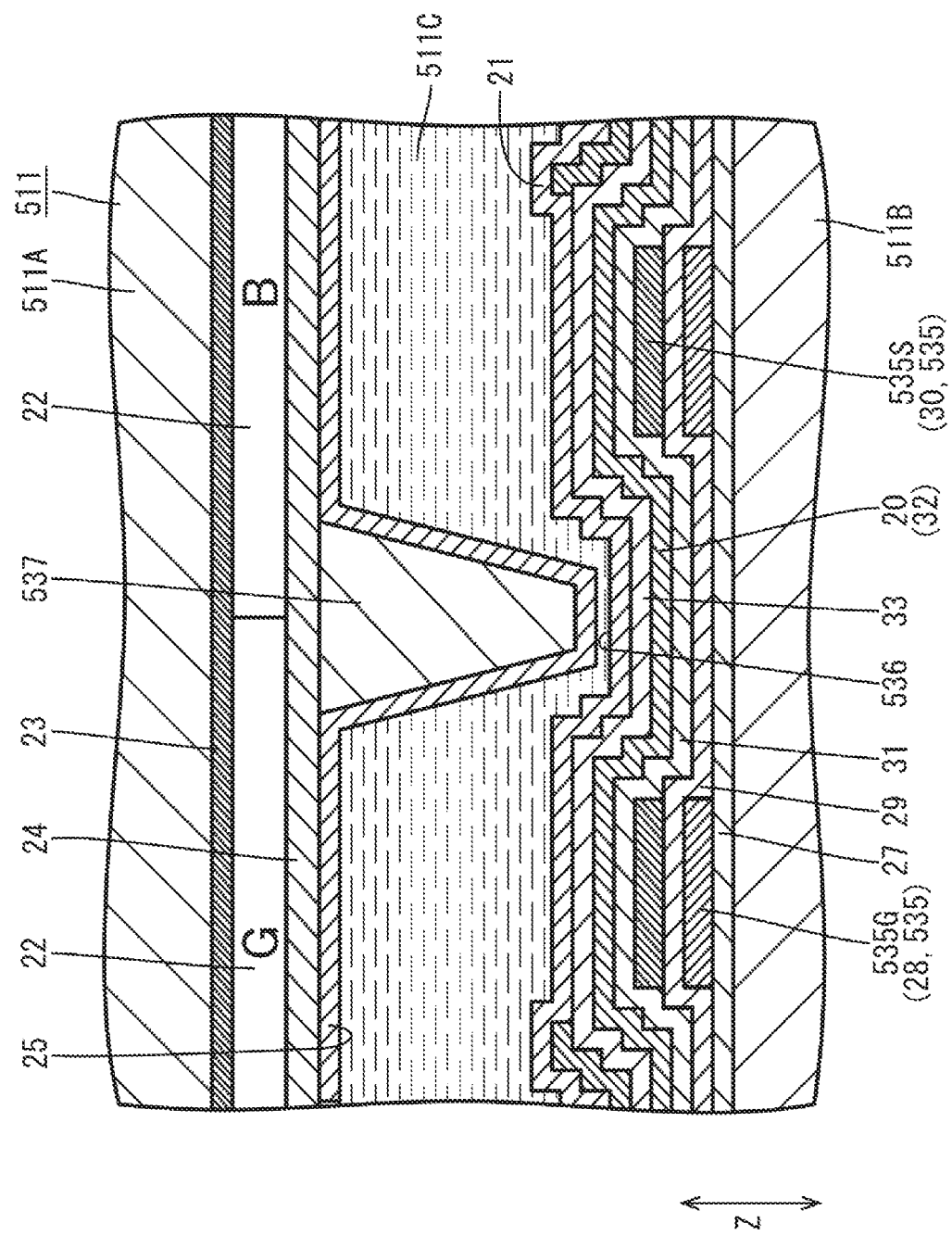
FIG. 18 is a cross-sectional view taken along line J-J of FIG. 17 in the liquid crystal panel.

Referring to FIG. 17 or FIG. 18, explanation will be given on the sixth embodiment. The sixth embodiment exemplifies a case in which from the above-mentioned first embodiment, the configuration of an annular line part 535 is altered. Additionally, with respect to the configuration, function and effect that are the same as those in the aforementioned first embodiment, overlapped explanations will be omitted.

As shown in FIG. 17 and FIG. 18, a gate side annular line part 535G and a source side annular line part 535S included in an annular line part 535 related to the present embodiment have a ring shape without an end part, and have no opening 38 described in the aforementioned first embodiment. The gate side annular line part 535G and the source side annular line part 535S having the ring shape without end parts surround the spacer 537 inserted inside the concave part 536 over the entire peripheral portion thereof. Thus, the spacer 537 is made to be hardly positionally deviated in any directions along the peripheral direction. Moreover, even in the case when the spacer 537 is relatively displaced in the Z-axis direction relative to the array substrate 511B, because an external force is exerted on the liquid crystal panel 511 with the result that at least either one of the two substrates 511A and 511B is deformed, liquid crystal molecules inside the concave part 536 are made to be hardly extruded outside of the concave part 536 by the spacer 537. Thus, even when a great external force is suddenly exerted, an excessive stress is hardly exerted onto the paired substrates 511A and 511B.

As explained above, in accordance with the present embodiment, at least either one of the annular line parts 535 of the gate line 518 and the source line 519 have an annular shape with no end part. With this arrangement, the spacer 537 received in the concave part 536 is surrounded by the annular line part 535 having an annular shape with no end part, over the entire peripheral portion. Therefore, the spacer 537 is prevented from being positionally deviated in any directions along the peripheral direction. Moreover, for example, in the case when the liquid crystal layer 511C is present between the paired substrates 511A and 511B, even if an external force is exerted, liquid crystal molecules of the liquid crystal layer 511C inside the annular line part 535 having an annular shape with no end part are prevented from being extruded by the spacer 537. Thus, even when a great external force is suddenly exerted, an excessive stress is hardly exerted onto the paired substrates 511A and 511B. In particular, in the case when the liquid crystal panel 511 is curved, although a positional deviation is more easily exerted due to the curved CF substrate 511A and the array substrate 511B, even when such a positional deviation occurs, the spacer 537 is more highly positively allowed to exert the substrate interval holding function more desirably.

Embodiment 7

Figure 19:
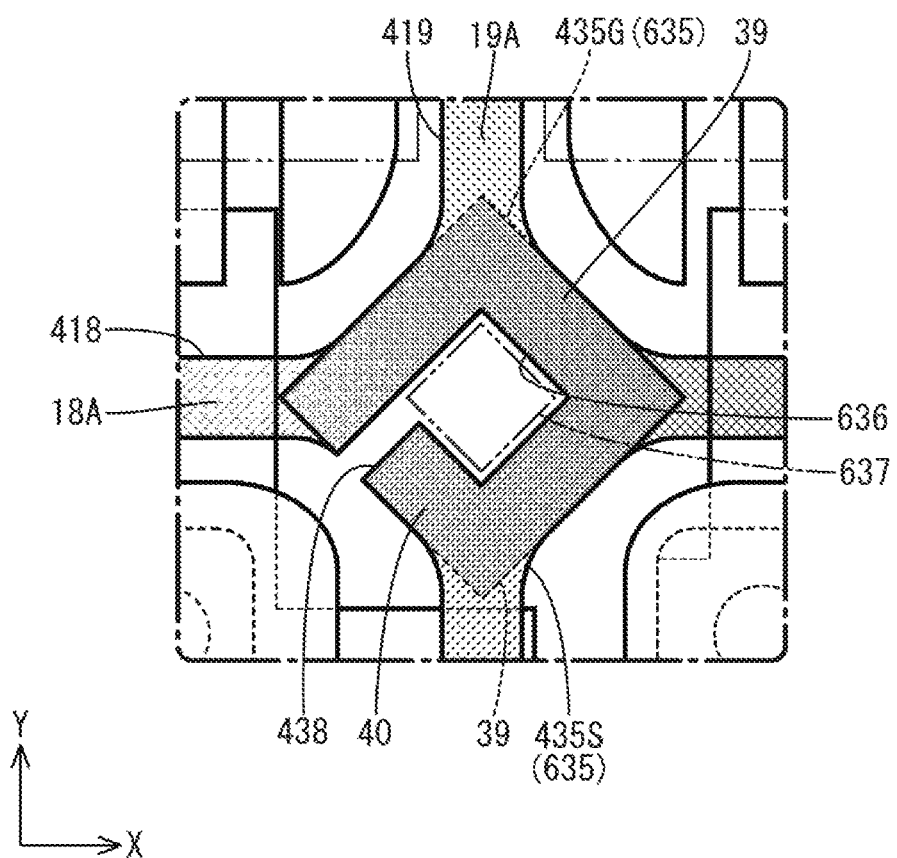
FIG. 19 is a plan view that shows the vicinity of a TFT in an enlarged manner in a display area of a liquid crystal panel in accordance with a seventh embodiment.

Referring to FIG. 19, explanation will be given on the seventh embodiment. The seventh embodiment exemplifies a case in which from the above-mentioned fifth embodiment, the configuration of an annular line part 635 is altered. Additionally, with respect to the configuration, function and effect that are the same as those in the aforementioned fifth embodiment, overlapped explanations will be omitted.

As shown in FIG. 19, the annular line part 635 of the present embodiment has an annular shape with a rhombus shape when seen in a plan view. In accordance with this shape, a concave part 636 on the center side of the annular line part 635 and a spacer 637 to be inserted therein respectively have rhombus shapes when seen in a plan view. With this configuration also, the same function and effects as those of the aforementioned first and fifth embodiments can be obtained.

Embodiment 8

Figure 20:
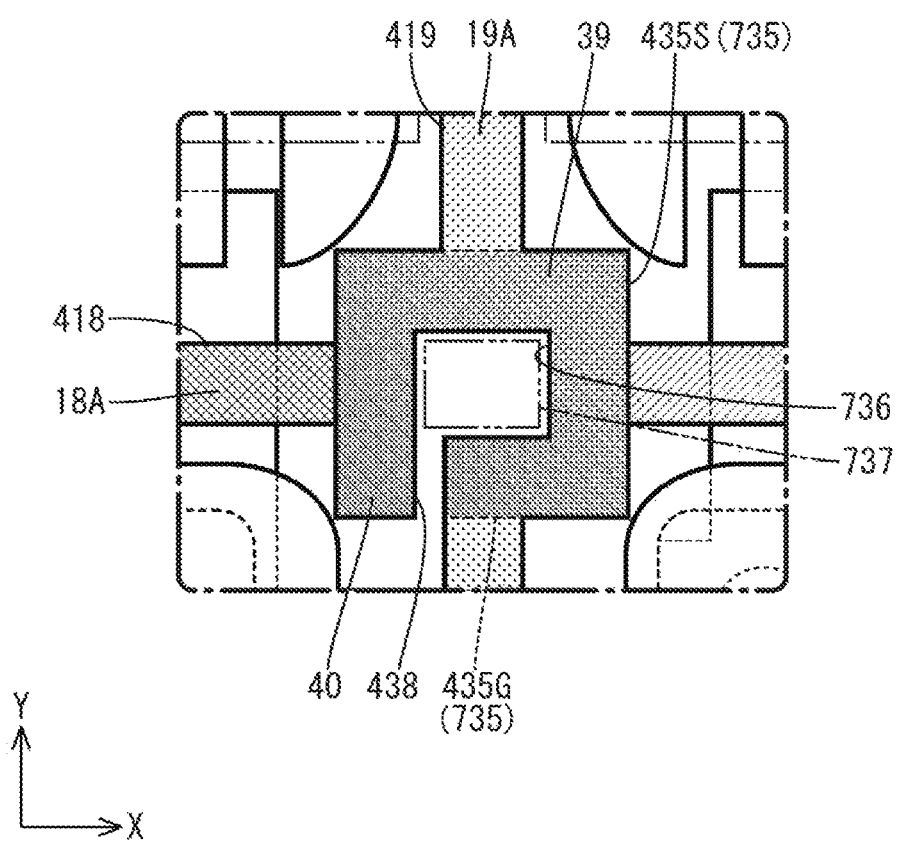
FIG. 20 is a plan view that shows the vicinity of a TFT in an enlarged manner in a display area of a liquid crystal panel in accordance with an eighth embodiment.

Referring to FIG. 20, explanation will be given on the eighth embodiment. The eighth embodiment exemplifies a case in which from the above-mentioned fifth embodiment, the configuration of an annular line part 735 is altered. Additionally, with respect to the configuration, function and effect that are the same as those in the aforementioned fifth embodiment, overlapped explanations will be omitted.

As shown in FIG. 20, the annular line part 735 of the present embodiment has an annular shape with a rectangular shape (square shape) when seen in a plan view. In accordance with this shape, a concave part 736 on the center side of the annular line part 735 and a spacer 737 to be inserted therein respectively have rectangular shapes when seen in a plan view. With this configuration also, the same function and effects as those of the aforementioned first and fifth embodiments can be obtained.

Ninth Embodiment

Figure 21:
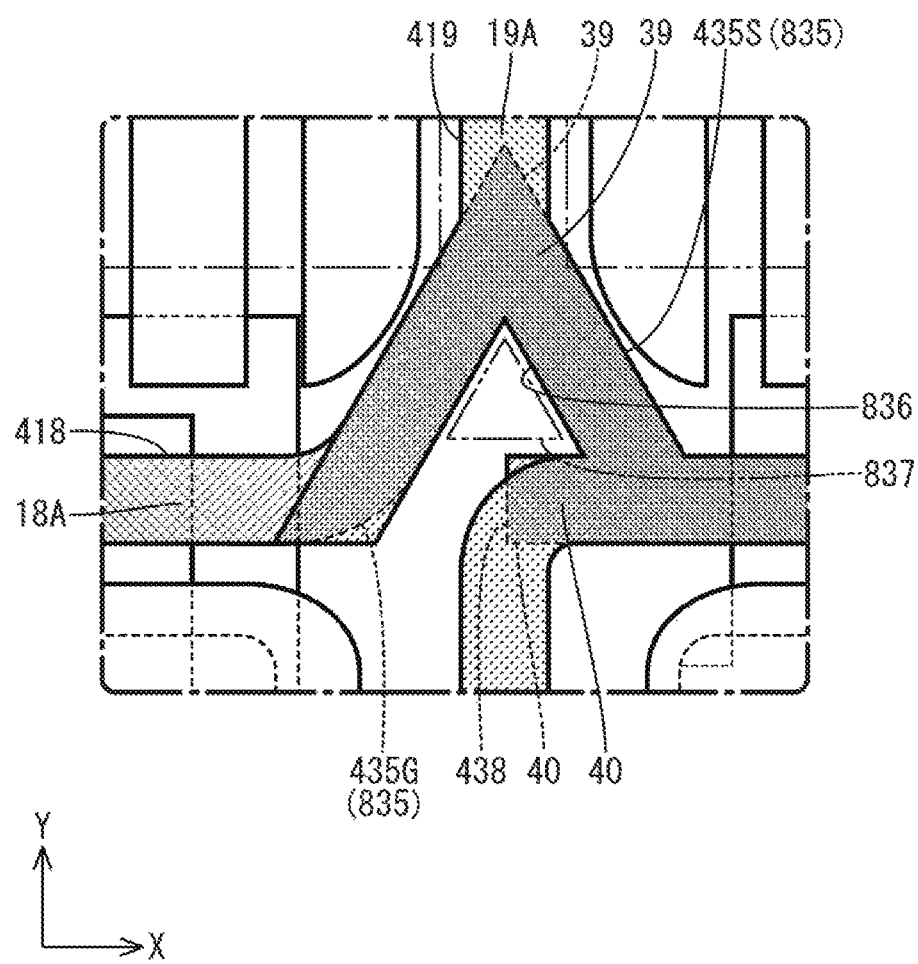
FIG. 21 is a plan view that shows the vicinity of a TFT in an enlarged manner in a display area of a liquid crystal panel in accordance with a ninth embodiment.

Referring to FIG. 21, explanation will be given on the ninth embodiment of the present embodiment. The ninth embodiment exemplifies a case in which from the above-mentioned fifth embodiment, the configuration of an annular line part 835 is altered. Additionally, with respect to the configuration, function and effect that are the same as those in the aforementioned fifth embodiment, overlapped explanations will be omitted.

As shown in FIG. 21, the annular line part 835 of the present embodiment has an annular shape with a triangular shape when seen in a plan view. In accordance with this shape, a concave part 836 on the center side of the annular line part 835 and a spacer 837 to be inserted therein respectively have triangular shapes when seen in a plan view. With this configuration also, the same function and effect as those of the aforementioned first and fifth embodiments can be obtained.

Other Embodiments

The technology described herein is not limited to the embodiments described above with reference to the drawings. The following embodiments may be included in the technical scope.

Figure 22:
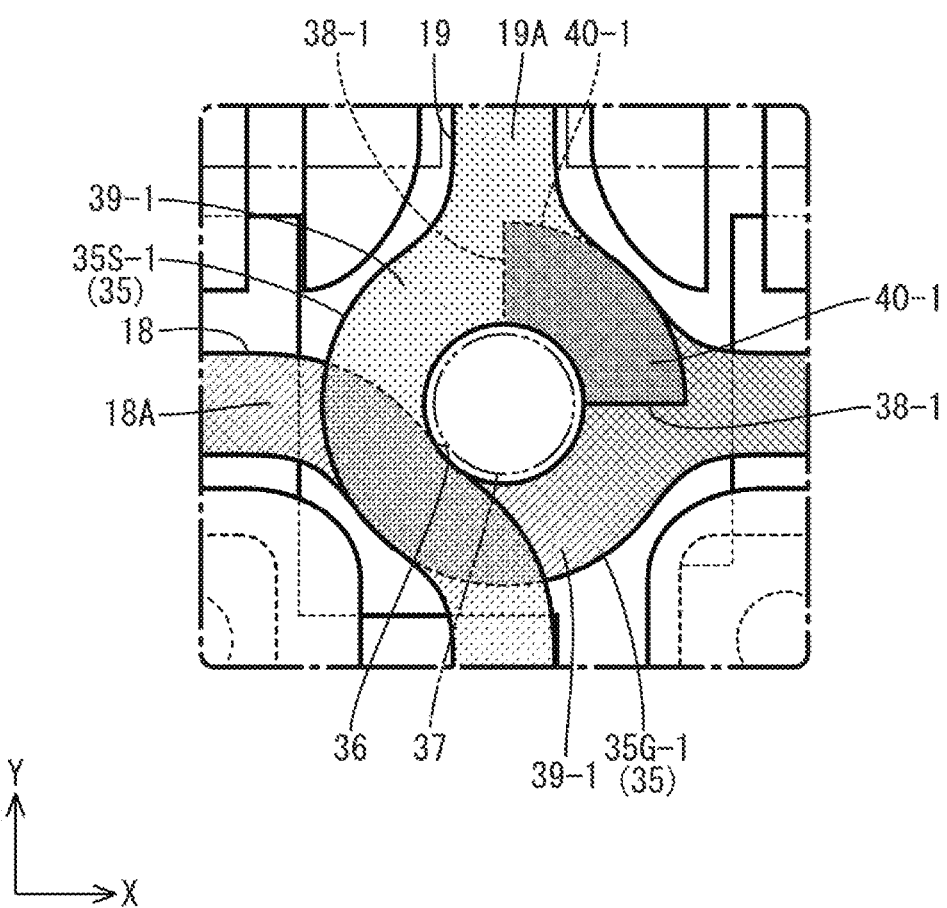
FIG. 22 is a plan view that shows the vicinity of a TFT in an enlarged manner in a display area of a liquid crystal panel in accordance with another embodiment (1).

(1) As a modified example of the aforementioned first embodiment, as shown in FIG. 22, in a gate side annular line part 35G-1 and a source side annular line part 35S-1, branch line parts 40-1 may be mutually overlapped with each other, with the respective openings 38-1 being disposed so as to overlap with the stem line part 39-1.

Figure 23:
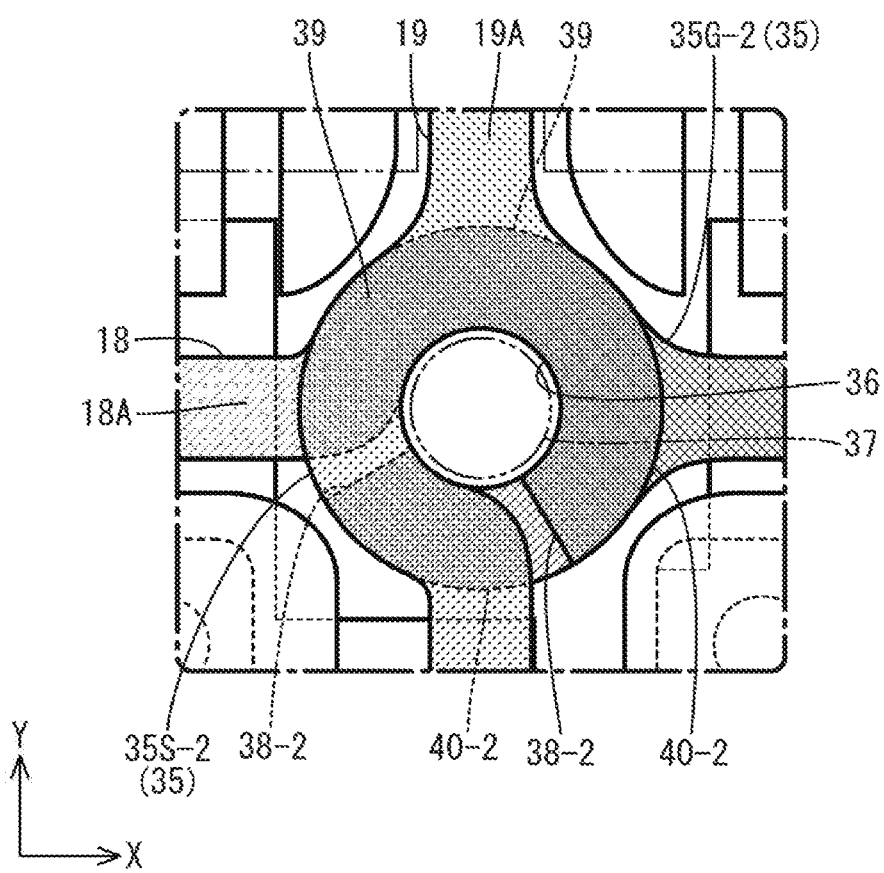
FIG. 23 is a plan view that shows the vicinity of a TFT in an enlarged manner in a display area of a liquid crystal panel in accordance with the other embodiment (2).

(2) As a modified example of the aforementioned first embodiment, as shown in FIG. 23, in a gate side annular line part 35G-2 and a source side annular line part 35S-2, the formation range of a branch line part 40-2 may be expanded, with the formation range of an opening 38-2 being limited to only a small range.

(3) The aforementioned respective embodiments have exemplified a configuration in which both of the gate line and the source line have the annular line part; however, only either one of the gate line and the source line may have the annular line part. In this case, the line having no annular line part of the gate line and the source line may be extended in a manner so as to overlap with at least one portion of the concave part.

(4) The aforementioned respective embodiments have exemplified a configuration in which the annular line part is formed at an intersecting part between the gate line and the source line; however, the annular line part may be formed at a portion other than the intersecting part between the gate line and the source line.

(5) The aforementioned respective embodiments have exemplified a configuration in which all the annular line parts are prepared as the annular shape with an end part or a configuration in which all the annular line parts are prepared as the annular shape with no end part; however, a configuration in which the annular line parts having the annular shape with an end part and the annular line parts having the annular shape with no end part are present in a mixed manner may be adopted.

(6) In addition to the aforementioned embodiments, the respective plane layouts of the stem line part, the branch line part and the opening in the case when the annular line part has an annular shape with an end part may be altered on demand.

(7) The aforementioned respective embodiments have exemplified a configuration in which the plane shapes of the annular line part, the concave part and the spacer are set to a round shape, a rectangular shape, a rhombus shape and a triangular shape; however, in addition to these, for example, an elliptical shape, an oval shape, a semi-circular shape, an arch shape, a trapezoidal shape, a polygonal shape of a pentagonal shape or more, etc. may be adopted.

(8) The above-mentioned first embodiment, as well as the fourth to ninth embodiments, and other embodiments (1) and (2) have exemplified a configuration in which the plane shapes of the concave part and spacer are set to a similar shape; however, the plane shapes of the concave part and the spacer may be set to a non-similar shape as in the case of those described in the second and third embodiments.

(9) The above-mentioned second and third embodiments have exemplified a configuration in which timings in which the spacer is made in contact with the annular line part are set to two times one after another; however, timings in which the spacer is made in contact with the annular line part may be set to three times or more one after another. This arrangement can be realized by combining the diameter dimension and plane shape of the annular line part and the concave part, and the plane shape and diameter dimension of the spacer with one another on demand.

(10) The aforementioned second embodiment has exemplified a configuration in which the diameter dimension of the gate side annular line part is made constant while the diameter dimension of the source side annular line part is made different to be greater or smaller; however, a configuration in which the diameter dimension of the source side annular line part is made constant while the diameter dimension of the gate side annular line part is made different to be greater or smaller may be adopted.

(11) The aforementioned second embodiment has exemplified a configuration in which the first source side annular line part and the second source side annular line part are present in a mixed manner; however, all the source side annular line parts may be set to the first source side annular line parts, or all the source side annular line parts may be set to the second source side annular line parts.

(12) The aforementioned third embodiment has exemplified a configuration in which the plane shapes of the concave part and the spacer are made to be non-similar shapes relative to one portion of the annular line part; however, the plane shapes of the concave part and the spacer may be made to similar shapes relative to all the annular line parts. In contrast, the plane shapes of the concave part and the spacer may be made to be non-similar shapes relative to all the annular line parts.

(13) The aforementioned third embodiment has exemplified a configuration in which the plane shapes of the annular line parts are set to be two kinds of a rhombus shape and a rectangular shape; however, two kinds of a rhombus shape and a round shape, two kinds of a rhombus shape and a triangular shape, two kinds of a rectangular shape and a round shape or two kinds of a rectangular shape and a triangular shape may be adopted. In addition to these, a specific plane shape or the like of the annular line part may be altered on demand, and for example, the annular line part described in the fourth to ninth embodiments may also be adopted. Moreover, the plane shape of the annular line part may be made as three or more kinds of different shapes. In contrast, the plane shape of the annular line part may be made as only one kind.

(14) The aforementioned third embodiment has exemplified a configuration in which the inner and outer peripheral ends on the source side annular line part and the gate side annular line part are disposed at offset positions; however, the inner and outer peripheral ends on the source side annular line part and the gate side annular line part may be disposed so as to be aligned to substantially the same positions.

(15) The aforementioned second and third embodiments have exemplified a configuration in which all the plane shapes of the spacers are the same; however, the spacer to be entered to the concave part of the first source side annular line part and the spacer to be entered to the concave part of the second source side annular line part may be made different in their plane surfaces.

(16) The aforementioned fourth embodiment has exemplified a configuration in which the opening of the annular line part disposed so as to be directed to the color filter side exerting blue color; however, the opening of the annular line part may be disposed so as to be directed to a color filter side exerting red color having a visual sensitivity lower than that of green color. More specifically, for example, in the case when the annular line part having a layout where a color filter exerting green and a color filter exerting red are adjacent to each other, the layout where the opening is directed to the color filter side exerting red is preferably adopted.

(17) The plane surface shape of the annular line part described in the aforementioned fourth to sixth embodiments and the other embodiments (1) and (2) may be altered to a shape such as a rhombus shape, a rectangular shape, a triangular shape, or the like, as described in the seventh to ninth embodiments.

(18) The aforementioned respective embodiments have exemplified a configuration in which the gate line and the source line have the annular line part; however, in the case when, for example, capacitance line is formed on the array substrate in addition to the gate line and the source line, the capacitance line may have the configuration provided with the annular line part. In addition to these, for example, in the case when a liquid crystal panel is formed by making incellation of a touch panel pattern, the touch panel line formed on the array substrate may have a configuration provided with the annular line part.

(19) The aforementioned respective embodiments have exemplified a configuration in which the light shielding part formed on the CF substrate is prepared as a lattice pattern so as to overlap with both of the gate line and the source line; however, the light shielding part may be prepared as a belt shape that overlaps with either one of the gate line and the source line.

(20) The aforementioned respective embodiments have exemplified a configuration in which a TFT has a double gate structure with two gate electrodes; however, a single gate structure in which the TFT has only one gate electrode may be adopted. Moreover, a specific configuration relating to the TFT (for example, line disposing route of the channel part) may be altered on demand.

(21) The aforementioned respective embodiments have exemplified a configuration in which the semiconductor film is formed as a silicon thin film; however, the semiconductor film may be formed as an amorphous silicon thin film, or may be formed as an oxide semiconductor thin film. In this case, the TFT is formed into a bottom gate type in which the gate electrode is disposed on the lower layer side of the channel part. Furthermore, in the case when the semiconductor film is formed as the amorphous silicon thin film or the oxide semiconductor thin film, a first transparent electrode film desirably forms the pixel electrode, and a second transparent electrode film desirably forms the common electrode; however, the technology described herein is not intended to be limited thereby.

(22) The aforementioned respective embodiments have exemplified a configuration in which the display mode of a liquid crystal panel is set to an IPS mode; however, the display mode may be set to an FFS mode, a TN mode, a VA mode, an RTN mode or the like.

(23) The aforementioned embodiments have exemplified a configuration in which the gate line is disposed on the lower layer side of the source line while the source line is disposed on the upper layer side of the gate line respectively; however, the gate line may be disposed on the upper layer side of the source line while the source line may be disposed on the lower layer side of the gate line respectively.

(24) The aforementioned embodiments have exemplified a configuration in which the plane shape of the pixel electrode is prepared as a longitudinally long rectangular shape; however, the plane shape of the pixel electrode may be prepared as a laterally long rectangular shape, or the like. Moreover, three pixel electrodes that are opposed to color filters of three colors exerting blue, green and red colors may all have the same size; however, all the electrodes or one portion thereof may have different sizes. Furthermore the number of slits to be installed and formed on the pixel electrodes and the plane shape of the slits may be altered on demands to those different from those illustrated on the drawing.

(25) The aforementioned embodiments have exemplified a configuration in which spacers are disposed at all the intersecting parts between a plurality of the gate lines and a plurality of the source lines respectively; however, another configuration in which no spacers are disposed at some of the intersecting parts between the plural gate lines and the plural source lines respectively may be used. In this case, with respect to the intersecting parts between the gate lines and the source lines where no spacers are disposed, non-formation places of the annular line parts may selectively formed. With this arrangement, generation of bubbles due to the spacer can be desirably suppressed.

(26) The aforementioned embodiments have exemplified a configuration in which the plane shape of the liquid crystal panel is prepared as a longitudinally long rectangular shape; however, the plane shape of the liquid crystal display device may be prepared as a longitudinally long rectangular shape, a square shape, a round shape, a semi-circular shape, an oval shape, an elliptical shape, a trapezoidal shape, or the like.

(27) The aforementioned respective embodiments have exemplified a liquid crystal display device provided with a liquid crystal panel; however, as long as a pair of substrates are installed therein, a display device provided with any other kind of display panel, such as (PDP (plasma display panel), an organic EL panel, EPD (microcapsule-type display panel of electrophoretic system), MEMS (Micro Electro Mechanical Systems) display panel, etc.) may be adopted.

(28) The aforementioned respective embodiments and the above-mentioned (27) are configured on the premise that a display panel is provided with a pair of substrates; however, the technology described herein is also applicable to a display device having a configuration in which, for example, a display panel itself is prepared by forming various kinds of elements, such as a TFT or the like on one sheet of a substrate, and on the substrate of the display panel, substrates, such as a touch panel, a cover glass or the like, are bonded. In this case, a spacer for maintaining an interval between the substrate of the display panel and the substrate of the touch panel or the cover glass is installed. Additionally, as an example of a display panel constituted by one sheet of a substrate, an organic EL panel is proposed; however, in addition to this, the panel may be altered on demands.

The invention claimed is:

1. A display device comprising:
 a pair of substrates disposed so as to be opposed to each other with an interval therebetween;
 lines installed on one substrate of the paired substrates;
 a spacer installed on the other substrate so as to be interposed between the paired substrates; and
 an annular line part that is composed of one portion of the line, and has an annular shape with a concave portion to receive the spacer formed on the center side; wherein
 the lines comprise a first line, and a second line that is disposed on an upper layer side relative to the first line, with an insulating film interposed therebetween, and intersects with the first line;
 the annular line part is formed on at least either one of the first line and the second line at the intersecting part therebetween;
 the annular line part is formed on each of the two intersecting parts between the first line and the second line;
 at least one of the annular line parts of the first line and the second line has an annular shape having end parts with an opening between the two end parts; and
 both of the annular line parts of the first line and the second line have an annular shape having end parts, with the openings being mutually kept in a non-overlapped state.

2. The display device according to claim 1, wherein of the first line and the second line, the one having the annular line part with the annular shape having end parts is provided with a line main body connected to the annular line part having the annular shape with end parts, and the annular line part having the annular shape with end parts is composed of a stem line part having two end parts connected to the line main body and a branch line part, with one of the end parts being connected to the same portion as the stem line part of the line main body.

3. The display device according to claim 1, wherein on the other substrate, a light shielding part, which is overlapped with at least one of the first line and the second line, and has the center portion thereof offset relative to the center of at least one of the first line and the second line serving as the overlapping target, is formed, and the annular line part is disposed so as to allow the opening to be directed to the center side of the light shielding part.

4. The display device according to claim 1, wherein on the other substrate, a plurality of color filters exerting respectively different colors are disposed in parallel with one another, either the first line or the second line is disposed on a plane so as to partition between the plural color filters having different colors, and the annular line part is disposed so as to allow the opening to be directed to the color filter side having a relatively lower visual sensitivity of the adjacent color filters.

5. The display device according to claim 1, wherein in the first line and the second line, positions of end parts on the concave part side in the mutual annular line parts are aligned with each other.

6. The display device according to claim 1, wherein in the first line and the second line, the annular line part of the second line is partially overlapped with the annular line part of the first line, and is disposed on the concave part side.

7. The display device according to claim 6, wherein the annular line part has a plane shape of the concave part thereof made to be a non-similar shape to the plane shape of the spacer.

8. The display device according to claim 1, wherein in the first line and the second line, the annular line part of the second line is partially overlapped with the annular line part of the first line, and is disposed on a side opposite to the concave part side.

9. The display device according to claim 8, wherein the annular line part has a plane shape of the concave part thereof made to be a similar shape to the plane shape of the spacer.

* * * * *